United States Patent
Miyazaki et al.

(10) Patent No.: US 7,528,581 B2
(45) Date of Patent: May 5, 2009

(54) BATTERY APPARATUS FOR CONTROLLING PLURAL BATTERIES AND CONTROL METHOD OF PLURAL BATTERIES

(75) Inventors: Hideki Miyazaki, Hitachi (JP); Akihiko Emori, Hitachi (JP); Akihiko Kudo, Fukaya (JP); Tsuyoshi Kai, Ohira (JP)

(73) Assignees: Shin-Kobe Electric Machinery Co., Ltd., Tokyo (JP); Hitachi, Ltd., Tokyo (JP)

( * ) Notice: Subject to any disclaimer, the term of this patent is extended or adjusted under 35 U.S.C. 154(b) by 0 days.

(21) Appl. No.: 11/475,253

(22) Filed: Jun. 27, 2006

(65) Prior Publication Data
US 2007/0018613 A1 Jan. 25, 2007

Related U.S. Application Data

(60) Continuation of application No. 11/103,639, filed on Apr. 12, 2005, now Pat. No. 7,091,695, which is a continuation of application No. 10/810,674, filed on Mar. 29, 2004, now Pat. No. 6,891,352, which is a division of application No. 10/079,423, filed on Feb. 22, 2002, now Pat. No. 6,762,588.

(30) Foreign Application Priority Data
Aug. 29, 2001 (JP) ............................. 2001-258859

(51) Int. Cl.
*H02J 7/06* (2006.01)
(52) U.S. Cl. .................... 320/163; 320/116; 324/434
(58) Field of Classification Search ............... 320/116, 320/163; 324/434
See application file for complete search history.

(56) References Cited

U.S. PATENT DOCUMENTS

| | | | |
|---|---|---|---|
| 5,557,188 A | 9/1996 | Piercey | |
| 5,773,962 A | 6/1998 | Nor | |
| 5,998,969 A * | 12/1999 | Tsuji et al. | 320/132 |
| 6,133,709 A * | 10/2000 | Puchianu | 320/116 |
| 6,262,561 B1 | 7/2001 | Takahashi et al. | |
| 6,297,616 B1 | 10/2001 | Kubo et al. | |
| 6,297,618 B2 | 10/2001 | Emori et al. | |
| 6,404,166 B1 | 6/2002 | Puchianu | |
| 6,430,066 B2 | 8/2002 | Emori et al. | |
| 6,680,600 B2 | 1/2004 | Emori et al. | |
| 6,700,349 B2 | 3/2004 | Emori et al. | |

(Continued)

FOREIGN PATENT DOCUMENTS

EP 1067393 A2 1/2001

(Continued)

*Primary Examiner*—Akm Enayet Ullah
*Assistant Examiner*—Aaron Piggush
(74) *Attorney, Agent, or Firm*—Dickstein Shapiro LLP

(57) ABSTRACT

Lower order control devices control plural battery cells configuring plural battery modules. An input terminal of the low order control device in the highest potential, an output terminal of the low order control device in the lowest potential, and a high order control device are connected by isolating units, photocouplers. Diodes which prevent a discharge current of the battery cells in the battery modules are disposed between the output terminal of the low order control device and the battery cells in the battery module on the low potential side. Terminals related to input/output of a signal are electrically connected without isolating among the plural low order control devices.

21 Claims, 9 Drawing Sheets

U.S. PATENT DOCUMENTS

| | | |
|---|---|---|
| 6,747,438 B2 | 6/2004 | Emori et al. |
| 6,762,588 B2 * | 7/2004 | Miyazaki et al. ............ 320/116 |
| 6,891,352 B2 * | 5/2005 | Miyazaki et al. ............ 320/118 |
| 6,917,181 B2 | 7/2005 | Emori et al. |
| 6,977,480 B2 | 12/2005 | Emori et al. |
| 7,009,401 B2 | 3/2006 | Kinoshita et al. |
| 7,075,306 B2 | 7/2006 | Emori et al. |
| 7,085,661 B2 | 8/2006 | Emori et al. |
| 7,091,695 B2 * | 8/2006 | Miyazaki et al. ............ 320/116 |
| 7,173,397 B2 | 2/2007 | Kinoshita et al. |
| 2003/0195719 A1 | 10/2003 | Emori et al. |
| 2004/0138758 A1 | 7/2004 | Evans et al. |
| 2005/0110460 A1 | 5/2005 | Arai et al. |
| 2005/0242667 A1 | 11/2005 | Emori et al. |
| 2005/0242776 A1 | 11/2005 | Emori et al. |
| 2006/0109008 A1 | 5/2006 | Emori et al. |
| 2006/0202693 A1 | 9/2006 | Zhou |
| 2006/0202857 A1 | 9/2006 | Kawahara et al. |
| 2006/0247871 A1 | 11/2006 | Emori et al. |
| 2007/0108946 A1 | 5/2007 | Yamauchi et al. |
| 2007/0145954 A1 | 6/2007 | Kawahara et al. |

FOREIGN PATENT DOCUMENTS

| | | |
|---|---|---|
| JP | 10-322925 | 12/1998 |
| JP | 11-196535 | 7/1999 |
| JP | 11-196537 | 7/1999 |
| JP | 2000-014027 | 1/2000 |
| JP | 2000-92732 | 3/2000 |
| JP | 2000-209786 | 7/2000 |
| JP | 2001-37077 | 2/2001 |
| JP | 2001-186765 | 7/2001 |
| JP | 2001-224138 | 8/2001 |
| JP | 2001-258170 | 9/2001 |
| JP | 2002-170535 | 6/2002 |
| JP | 2003-035755 | 2/2003 |
| JP | 2003-164068 | 6/2003 |
| JP | 2003-303627 | 10/2003 |
| JP | 2004-048991 | 2/2004 |
| JP | 2004-134372 | 4/2004 |
| JP | 2004-138586 | 5/2004 |
| JP | 2004-215459 | 7/2004 |
| JP | 2005-003414 | 1/2005 |
| JP | 2005-129270 | 5/2005 |
| JP | 2005-318750 | 11/2005 |
| JP | 2005-318751 | 11/2005 |
| JP | 2005-328603 | 11/2005 |
| JP | 2006-189436 | 7/2006 |
| JP | 2006-242880 | 9/2006 |
| JP | 2006-260981 | 9/2006 |
| JP | 2006-262647 | 9/2006 |
| JP | 2006-294339 | 10/2006 |
| JP | 2006-296034 | 10/2006 |
| JP | 2006-296036 | 10/2006 |
| JP | 2007-104900 | 4/2007 |
| JP | 2007-141464 | 6/2007 |
| JP | 2007-165211 | 6/2007 |
| WO | WO 98/32181 | 7/1998 |
| WO | WO 00/05596 | 2/2000 |

* cited by examiner

| No. | A1 | A2 | A3 | CLK | M1 Q | M2 Q | M3 Q | M4 Q | M5 Q | M6 Q | M7 Q | CLR 1 | CLR 2 |
|---|---|---|---|---|---|---|---|---|---|---|---|---|---|
| 1 | – | 0 | 0 | 0 | – | – | – | – | – | – | 1 | 1 | 0 |
| 2 | 1 | 1 | 0 | 0 | 1 | – | – | – | – | – | 1 | 0 | 1 |
| 3 | 1 | 0 | 1 | 0 | 0 | 1 | – | – | – | – | 1 | 0 | 1 |
| 4 | 1 | 1 | 1 | 0 | 1 | 1 | – | – | – | – | 1 | 0 | 1 |
| 5 | 0 | 1 | 0 | 0 | 1 | 1 | 1 | 1 | 1 | 1 | 0 | 0 | 1 |
| 6 | 0 | 0 | 1 | 0 | 0 | 1 | 1 | 1 | 1 | 1 | 0 | 0 | 1 |
| 7 | 0 | 1 | 1 | 0 | 1 | 0 | 1 | 1 | 1 | 1 | 0 | 0 | 1 |

BATTERY APPARATUS FOR CONTROLLING PLURAL BATTERIES AND CONTROL METHOD OF PLURAL BATTERIES

CROSS REFERENCE TO RELATED APPLICATIONS

This application is a continuation of U.S. patent application Ser. No. 11/103,639, filed Apr. 12, 2005, (now U.S. Pat. No. 7,091,695, issued Aug. 15, 2006), which is a continuation of U.S. patent application Ser. No. 10/810,674, filed Mar. 29, 2004, (now U.S. Pat. No. 6,891,352, issued May 10, 2005), which is a divisional of U.S. patent application Ser. No. 10/079,423, filed Feb. 22, 2002, (now U.S. Pat. No. 6,762,588, issued Jul. 13, 2004), which claims priority to Japanese Patent Application No. 2001-258859, the disclosures of which are incorporated by reference in their entirety.

BACKGROUND OF THE INVENTION

The present invention relates to a battery apparatus for controlling plural high energy battery cells connected in series and its control method, and more particularly to a battery apparatus which is suitable for a low order control device which controls a battery module having plural battery cells connected in series and a high order control device for giving instructions to plural low order control devices.

For example, Japanese Patent Laid-Open Publication No. 10-322925 describes a conventional battery apparatus which is comprised of plural battery cells connected in series as a battery module, plural battery modules being connected in series, and a low order control device disposed for each battery module, a command being sent from a high order control device to the low order control device. The low order control devices monitor the states of the battery cells possessed by the corresponding battery modules. The low order control devices disposed in the same quantity as that of the battery modules are electrically connected in series via the battery modules, a signal is transmitted between the high order control device and the low order control devices and between the low order control devices by an isolating unit such as a photocoupler in a configuration that no affect is caused by a potential difference between the control devices.

The low order control device adjusts the capacity of the battery cells as described in Japanese Patent Laid-Open Publication No. 2000-92732 for example. The capacity adjustment means the reduction of a voltage difference between the battery cells by having a resistor connected in parallel to the battery cells via a switch, and when the battery cells measured by a voltage detection circuit have a high voltage, driving the switch to partly discharge the amount of electricity stored. Particularly, a lithium-ion battery, which has amorphous carbon with high relevancy between an open-circuit voltage and a remaining capacity as an anode active material, can effectively equalize the capacity of each battery cell by reducing a voltage difference between the battery cells.

In recent years, there has been used an ultra capacitor which can store the same amount of electricity as the secondary battery and has less degradation in service life as compared with the secondary battery. The ultra capacity adopts a method of equalizing the voltage between the capacitor cells as described in Japanese Patent Laid-Open Publication No. 2001-37077 for example. This method provides a circuit which connects a switch in parallel to the capacitor cells to detect the voltage of the capacitor and bypasses part of electricity to the switch. It is similar to the aforesaid Japanese Patent Laid-Open Publication No. 2000-92732.

The low order control device detects a voltage of the battery cell or the capacitor cell, and when the voltage is high, operates the switch to adjust the capacity. Meanwhile, the high order control device sends an instruction signal to make the low order control device to adjust the capacity. In Japanese Patent Laid-Open Publication No. 2000-92732, an open-circuit voltage of each battery cell of the battery module is measured when the low order control device is activated, and the measured value is transmitted to the high order control device. The high order control device calculates a reference voltage value at the time of capacity adjustment from the value of open-circuit voltage obtained from all the low order control devices and gives instructions to the low order control devices again.

SUMMARY OF THE INVENTION

Problems to be remedied by the present invention are following three. First, it is a cost problem. The secondary battery and the ultra capacitor are expected to be used for a battery apparatus for the electric car or the hybrid electric car, but it is demanded that their costs are reduced for mass production. For the cost reduction of the battery apparatus, it is necessary to reduce the cost of the battery cell or the capacitor cell itself and also to reduce the costs of the plural low order control devices. To achieve it, it is effective to have the low order control devices as ICs (integrated circuits).

However, even when the low order control device is ICed, the isolating unit such as a photocoupler used for the signal transmission between the high order control device and the low order control devices and between the low order control devices remains as it is. For example, when a lithium-ion battery is used, it is assumed that the battery cell has a voltage of 3.6V and 40 batteries are connected in series, this potential difference is 144 V between the battery in the lowest potential and the battery in the highest potential. In this example, if four battery cells are grouped into each battery module, ten low order control devices are provided, and the respective low order control devices are provided with about two isolating units for input and output. Thus, a total of 20 isolating units are necessary, and there is a disadvantage that the control devices cost high.

Second, there is a problem of reliability. There is a possibility that an external interference enters the instruction signal due to noise produced by an inverter device or the like which is connected as a load on the battery apparatus. Therefore, there is a problem that the reliability of the signal transmission is decreased when instructions are given from the high order control device to the low order control devices because of the external interference.

Third, there is a problem of accuracy of detecting a voltage. The plural low order control devices are provided with a voltage detection circuit and detect a voltage of the battery cells disposed in the corresponding battery modules, but the battery voltage detection needs highly accurate performance with merely an allowable error of several tens of mV. A lithium-ion battery, which uses amorphous carbon for the anode active material, has an obvious relation between the open-circuit voltage and the remaining capacity as compared with another battery such as a nickel metal hydride battery. But, it is said that even the lithium-ion battery has an allowable error of ±50 mV or less in voltage equalization for the capacity adjustment. Conversion of a voltage of 50 mV is equivalent to about 5% of the remaining capacity of the lithium-ion battery. The highest voltage of the lithium-ion battery is about 4.2V but the aforementioned 50 mV is 1.2% with respect to 4.2%, indicating that the accuracy of voltage detection is very strict.

In order to achieve the highly accurate voltage detection, an A/D converter of ten-odd bits is generally used, but the accuracy of the A/D converter depends on the accuracy of a reference voltage source.

Therefore, the low order control device needs a highly accurate reference voltage source with an extremely small error (e.g., about ±25 mV). Since each low order control device is connected to the battery module having a different potential, it is difficult to share the highly accurate reference voltage source with the plural low order control devices. Specifically, to achieve the highly accurate voltage detection, there was a problem that the cost of the reference voltage sources which are respectively provided for the plural low order control devices became high.

A first object of the present invention is to provide a battery apparatus which has a quantity of isolating units decreased and is provided with low-cost control devices.

A second object of the invention is to provide a control method of a battery apparatus, which reduces the influence by external interferences such as noise and can make the signal transmission with improved reliability.

A third object of the invention is to provide an inexpensive battery apparatus which can achieve the highly accurate voltage detection.

(1) In order to achieve the first object, the invention is directed to a battery apparatus comprising plural battery modules connected in series which have plural battery cells connected in series; plural low order control devices which are disposed in correspondence with the plural battery modules and control the plural battery cells configuring the battery modules; and a high order control device which controls the plural low order control devices, wherein there are provided an isolating unit or a potential converting unit which connects the input terminal of the low order control device in the highest potential among the plural low order control devices, the output terminal of the low order control device in the lowest potential, and the high order control device; and an interruption element which is disposed between the output terminal of the low order control device and the battery cells in the battery module on a low potential side and prevents the discharge current of the battery cells in the battery module; and terminals related to the input and output of a signal are electrically connected in a non-isolated state among the plural low order control devices.

By configuring as described above, the quantity of the isolating units can be reduced, and the low-cost control device can be obtained.

(2) In the item (1) above, it is preferable that the input terminal of the low order control device is electrically connected to the battery cell on a high potential side among the battery cells within the battery module being controlled by the low order control device.

(3) In the item (2) above, it is preferable that the plural low order control devices, the isolating unit or the potential conversion unit which is disposed on the low order control devices in the highest and lowest potentials, and the high order control device are mounted on the same package, and power is supplied from the outside of the package to the high order control device.

(4) To achieve the first object, the invention is directed to a control method of battery cells which is provided with plural battery modules connected in series which have plural battery cells connected in series; plural low order control devices which are disposed in correspondence with the plural battery modules and control the plural battery cells configuring the battery modules; and a high order control device which controls the plural low order control devices, wherein the high order control device compares a signal transmitted to the low order control device in the highest potential with a signal returning from the low order control device in the lowest potential, and transmits the next instruction when it is determined to be normal.

The aforementioned method enables to improve the reliability by reducing an influence due to the external interference such as noise.

(5) In the item (4), it is preferable that the low order control device detects the states of the plural battery cells of the battery module controlled by the low order control device, takes a logical add or a logical product of the state detection signal and an input signal transmitted from the low order control device in a high potential, and outputs the result to the low order control device in a low potential; and the high order control device determines a defect of the battery apparatus according to the signal returning from the low order control device in the lowest potential.

(6) In the item (4), it is preferable that the low order control device performs the capacity adjustment to discharge the remaining capacity of the battery cell when the voltage of the battery cells in the battery module is higher than a reference value, and the low order control device having completed the capacity adjustment gets into a sleep mode.

(7) To achieve the third object, the invention is directed to a battery apparatus, comprising plural battery modules connected in series which have plural battery cells connected in series; plural low order control devices which are disposed in correspondence with the plural battery modules and control the plural battery cells configuring the battery modules; and a high order control device which controls the plural low order control devices, wherein there are provided a voltage detecting unit which detects a voltage of the plural battery cells within the battery modules, and an error calibration terminal which calibrates an error of the voltage detecting unit.

By configuring as described above, the highly accurate voltage detection can be achieved, and the cost reduction can also be achieved.

(8) In the item (7), it is preferable that the voltage detecting unit is an A/D converter, and the low order control device compensates an output value by previously giving a digital value to the error calibration terminal of the A/D converter.

(9) In the item (8), it is preferable that the A/D converter comprises an integration unit which integrates a unit amount of electricity according to the number of pulses; a comparing unit which compares the integral value of the integration unit with the voltage of the battery cell and stops the pulse; a counter unit which outputs the number of pulses when the pulse is stopped by the comparing unit; and a compensation unit which compensates output of the counter unit according to the digital value given to the terminal for calibrating the error.

(10) In the item (9), it is preferable that the compensation unit changes a counted value of the counter unit according to the digital value given to the error calibration terminal to compensate an offset of the A/D conversion and changes a width of the pulse to compensate a gain of the A/D conversion.

Other objects, features and advantages of the invention will become apparent from the following description of the embodiments of the invention taken in conjunction with the accompanying drawings.

DETAILED DESCRIPTION OF THE EMBODIMENTS

The battery apparatus and its control method according to one embodiment of the invention will be described with reference to FIG. 1 to FIG. 10.

First, a general structure of the battery apparatus according to this embodiment will be described with reference to FIG. 1.

Figure 1:
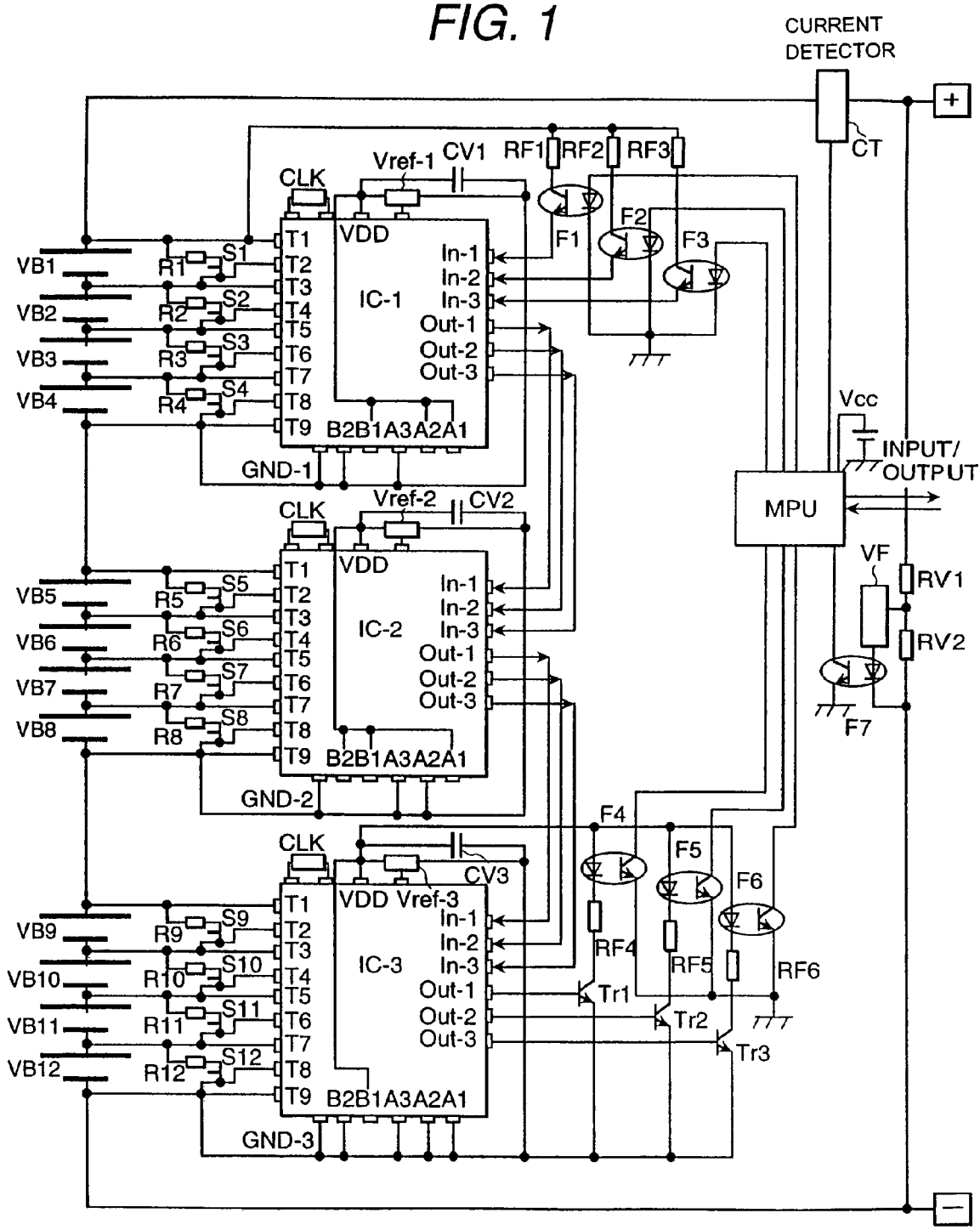
FIG. 1 is a circuit diagram showing a general structure of a battery apparatus according to one embodiment of the present invention.

FIG. 1 is a circuit diagram showing the general structure of the battery apparatus according to one embodiment of the invention.

Electric cells VB1, VB2, ..., VB12 which are secondary batteries are divided into battery modules each of which has four battery cells connected in series. A secondary battery apparatus used for an electric car or a hybrid electric car may be provided with tens to twenties of battery modules. But, this embodiment always has the same structure even when many modules are connected in series, so that the example of FIG. 1 shows a structure example having three battery modules connected in series.

In the shown example, a first battery module in the highest potential consists of the battery cells VB1, ..., VB4. Positive and negative electrodes of the respective battery cells VB1, ..., VB4 are connected to terminals T1, T3, T5, T7, T9 possessed by a first low order control device IC-1, respectively. A capacity adjustment circuit (SOC) comprised of a resistor R1 and a switching element S1 is provided between the positive and negative electrodes of the battery cell VB1. A control signal is input from a terminal T2 of the low order control device IC-1 to a gate terminal of the switching element S1. Similarly, capacity adjustment circuits comprised of a resistor R2 and a switching element S2, a resistor R3 and a switching element S3, and a resistor R4 and a switching element S4 are provided between the positive and negative electrodes of the battery cell VB2, the battery cell VB3 and the battery cell VB4, respectively. The gate terminals of the switching elements S2, S3 and S4 input a control signal from terminals T4, T6, T8 of the low order control device IC-1, respectively.

A second battery module in the middle potential is provided with the battery cells VB5, ..., VB8. Similar to the first battery module, positive and negative electrodes of battery cells VB5, ..., VB8 are respectively connected to terminals T1, T3, T5, T7, T9 possessed by a second low order control device IC-2. The battery cells VB5, ..., VB8 are also provided with a capacity adjustment circuit, which has a resistor R5 and a switching element S5, a resistor R6 and a switching element S6, a resistor R7 and a switching element S7, and a resistor R8 and a switching element S8 connected in series between the positive and negative electrodes.

Similarly, a third battery module in the lowest potential is provided with the battery cells VB9, ..., VB12. Positive and negative electrodes of the battery cells VB9, ..., VB12 are respectively connected to terminals T1, T3, T5, T7, T9 possessed by a third low order control device IC-3. The battery cells VB9, ..., VB12 are also provided with a capacity adjustment circuit, which has a resistor R9 and a switching element S9, a resistor R10 and a switching element S10, a resistor R11 and a switching element S11, and a resistor R12 and a switching element S12 connected in series between the positive and negative electrodes. And, the respective switching elements are driven by the third low order control device IC-3.

The internal structures, functions and peripheral parts of the low order control devices IC-1, IC-2, IC-3 will be described later with reference to FIG. 2 and later figures.

Then, connected relations of the low order control devices IC-1, IC-2, IC-3 will be described.

As the battery cell BV4 and the battery cell VB5 are connected in series, the first low order control device IC-1 and the second low order control device IC-2 are connected in series. Similarly, the second low order control device IC-2 and the third low order control device IC-3 are connected in series.

The high order control device MPU gives a command from the first low order control device IC-1 to the third low order control device IC-3. A control command output from the high order control device MPU is isolated by photocouplers F1, F2, F3 and transmitted to input terminals In-1, In-2, In-3 of the first low order control device IC-1. Light receiving side transistors of the photocouplers F1, F2, F3 are respectively connected to resistors RF1, RF2, RF3. The resistors RF1, RF2, RF3 receive power from the positive electrode of the battery cell VB1. The first low order control device IC-1 outputs the signals transmitted to the input terminals In-1, In-2, In-3 from output terminals Out-1, Out-2, Out-3. The output terminal Out-1, the output terminal Out-2 and the output terminal Out-3 are connected without electrical isolation to input terminals In-1, In-2, In-3 possessed by the second low order control device IC-2.

Similarly, the second low order control device IC-2 outputs the signals transmitted to the input terminals In-1, In-2, In-3 from the output terminals Out-1, Out-2, Out-3. The output terminals Out-1, Out-2, Out-3 of the second low order control device IC-2 are connected without electrical isolation to input terminals In-1, In-2, In-3 possessed by the third low order control device IC-3.

The low order control device IC-3 in the lowest potential operates corresponding transistors Tr1, Tr2, Tr3 by the signals output from the output terminals Out-1, Out-2, Out-3, and the respective transistors transmit the signals to the high order control device MPU via photocouplers F4, F5, F6 to which the second low order control device is connected. Here, the light emitting sides of the photocouplers F4, F5, F6 are connected to a reference voltage output terminal VDD of the low order control device IC-3 to receive an electric current from the reference voltage output terminal VDD. Resistors RF4, RF5, RF6 disposed between the light emitting sides of the photocouplers F4, F5, F6 and the transistors Tr1, Tr2, Tr3 are used to adjust an electric current passing to the light emitting sides of the photocouplers F4, F5, F6.

The internal circuit of the low order control device IC-1 has the negative electrode of the battery cell VB4 as a reference potential, and this reference potential is indicated by GND-1. The internal circuits of the low order control device IC-2 and the low order control device IC-3 have the negative electrodes of the battery cell VB8 and the battery cell VB12 as reference potentials, and these reference potentials are indicated by GND-2 and GND-3. The respective reference potentials GND-1, ..., GND-3 are different ground terminals used for the corresponding low order control devices IC-1, ..., IC-3. Meanwhile, the ground in the whole structure shown in FIG. 1 is assumed to be the negative electrode of a power supply Vcc for the high order control device MPU. The high order control device MPU and the low order control devices IC-1, ..., IC-3 are isolated by the photocouplers Fl, ..., F6, so that the negative electrode of the Vcc is also isolated from the respective reference potentials GND-1, ..., GND-3.

The terminals and peripheral parts of the low order control devices IC-1, ..., IC-3 will be described with reference to FIG. 2, but differences among the respective control devices IC-1, ..., IC-3 are potentials of the terminals A1, ..., A3 and terminals B1, B2 provided for them. These terminals are to compensate an error in detecting a voltage to be described with reference to FIG. 7, and a digital value "1" or "0" is given from the low order control device IC-1 to the terminals A1, ..., A3 and the terminals B1, B2 according to the voltage detection error separately possessed by the low order control device IS-3. Here, "1" is a reference voltage VDD of the low order control device, and "0" indicates potentials of the grounds GND-1, GND-2, GND-3 of the respective low order control devices. The aforementioned voltage detection error is different among the low order control devices IC-1, ..., IC-3, so that the value "1" or "0" of the terminals A1, ..., A3 and the terminals B1, B2 is different among the respective low order control devices IC-1, ..., IC-3 in the example of FIG. 1.

The high order control device MPU detects an electric current of charging and discharging passing to the battery module by an isolation type current detector CT. To detect a total voltage value of the battery modules connected in series, it is divided by resistors RV1, RV2. Here, the high order control device MPU and the respective battery modules are isolated from one another, so that the voltage divided by the resistors RV1, RV2 is temporarily converted into a pulse signal by a voltage-frequency converter VF, and output of the VF is transmitted to the high order control device MPU via a photocoupler F7. The high order control device MPU reads a total voltage of the battery modules from the output of the voltage-frequency converter VF obtained from the photocoupler F7 and calculates an average remaining capacity of the three battery modules based on the obtained value and the electric current obtained from the current detector CT.

When the electric car or the hybrid electric car has tens to twenties of battery modules, a structure that the highest low order control device IC-1 and the lowest low order control device IC-3 are connected via the high order control device MPU and the photocouplers is the same as in FIG. 1. Remaining tens to twenties of the low order control devices which are disposed in the same number as the battery modules are connected without isolation with the output terminal of the low order control device having input terminals In-1, In-2, In-3 disposed for a battery module in a potential higher by one level and the input terminal of the low order control device having the output terminals Out-1, Out-2, Out-3 disposed for a battery module in a potential lower by one level in the same way as the low order control device IC-2 of FIG. 1.

In the illustrated example, seven photocouplers F1, ..., F6, F7 are used as isolating units. A configuration consisting of three low order control devices IC-1, ..., IC-3 is shown in the example of FIG. 1, but even when there are ten low order control devices, the number of photocouplers as the isolating units may be seven. Meanwhile, according to a conventional configuration, when each battery module is comprised of four battery cells and provided with ten low order control devices, each of the low order control devices is provided with about two isolating units for input and output. Thus, a total of 20 isolating units are necessary. Meanwhile, because seven photocouplers are always enough in this embodiment, the number of isolating units can be decreased to reduce the cost of the control devices.

Then, an internal structure of the low order control device used for the battery apparatus according to this embodiment will be described with reference to FIG. 2.

Figure 2:
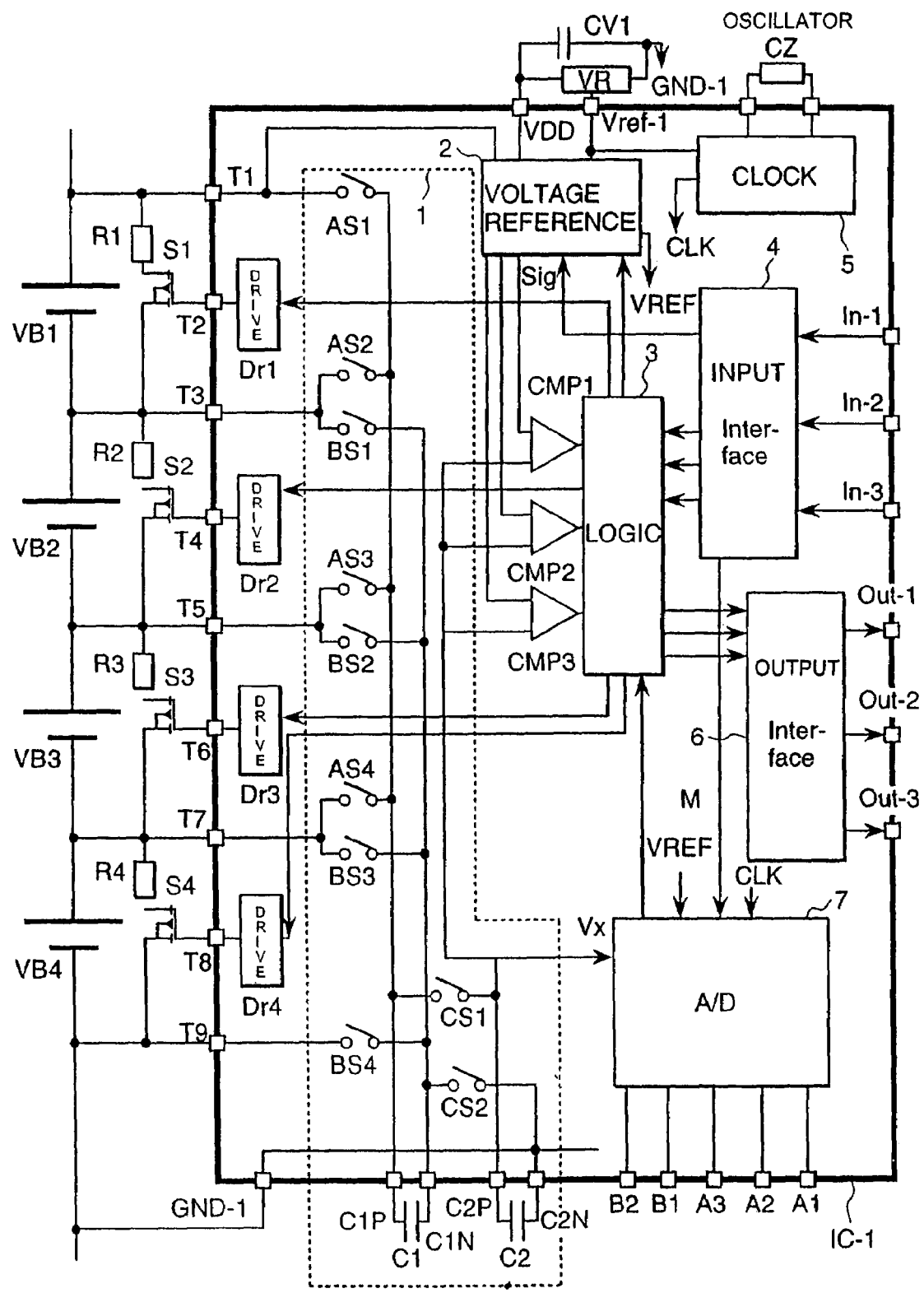
FIG. 2 is a circuit diagram showing an internal structure of the low order control device used for the battery apparatus according to one embodiment of the invention.

FIG. 2 is a circuit diagram showing the internal structure of the low order control device used for the battery apparatus according to one embodiment of the present invention. FIG. 2 shows the structure of the low order control device IC-1, and the other low order control devices IC-2, IC-3 have the same structure. Like reference numerals are used to indicate like components to those shown in FIG. 1.

Switching element drive units Dr1, Dr2, Dr3, Dr4 are respectively connected to control terminals of capacity adjustment switching elements S1, S2, S3, S4 and drive the respective switching elements S1, S2, S3, S4. The drive units Dr1, Dr2, Dr3, Dr4 each obtain a signal from a logic circuit 3 within the low order control device IC-1 and drive the switching elements S1, ..., S4 separately.

One end of analog switches AS1, AS2, AS3, AS4 is connected to the positive electrodes of the battery cells and the other end commonly connected to a positive terminal C1P of a capacitor C1. Similarly, analog switches BS1, BS2, BS3, BS4 have their one end connected to the negative electrodes of the battery cells and the other end commonly connected to a negative terminal C1N of the capacitor C1. And, an analog switch CS1 is connected to the positive terminal C1P of the capacitor C1 and the other end of the analog switch CS1 is connected to a positive terminal C2P of a second capacitor C2. Besides, an analog switch CS2 is connected to the negative terminal C1N of the capacitor C2 and the other end of the analog switch CS2 is connected to the negative terminal C2N of the second capacitor C2.

The analog switch AS1 and the analog switch BS1 are paired, and also AS2 and BS2, AS3 and BS3, and AS4 and BS4 are paired respectively and turned on or off at the same time. Pair (a) of the analog switch AS1 and the analog switch BS1, pair (b) of the analog switch AS2 and the analog switch BS2, pair (c) of the analog switch AS3 and the analog switch BS3, and pair (c) of the analog switch AS4 and the analog switch BS4 operate as four multiplexer switches. Specifically, one of the battery cells VB1, . . . , VB4 is selected by the multiplexer switches of (a), . . . , (d), and the selected battery cell is connected to the first capacitor CS1. Meanwhile, the analog switch CS1 and the analog switch CS2 are turned on or off simultaneously and, when they are turned on, the first capacitor CS1 and the second capacitor CS2 are connected.

It is assumed that the operation mode that the analog switch CS1 and the analog switch CS2 are turned on is (e). And, for example, when the battery cell VB1 is measured for a voltage, the logic circuit 3 alternately repeats a first mode to turn on the pair (a) of the analog switch AS1 and the analog switch BS1 and a second mode to turn on the pair (e) of the analog switch CS1 and the analog switch CS2. During the above operation, the multiplexer switches of (b), . . . , (d) are held off. The first mode (a) and the second mode (e) are pulse repeated for hundreds of times to finally have the same voltage among the battery cell VB1, the analog switch CS1, and the analog switch CS2. This is because when (a) and (b) are performed once, an electric current corresponding to a potential difference between the battery cell VB1 and the analog switch CS1 and between the analog switch CS1 and the analog switch CS2 flows, and a potential difference is reduced.

The first mode to turn on the pair (b) of the analog switch AS2 and the analog switch BS2 and the second mode to turn on the pair (e) of the analog switch CS1 and the analog switch CS2 are alternately repeated, during which the multiplexer switches of (a), (c) and (d) are held off, and the first mode (b) and the second mode (e) are pulse repeated for hundreds of times. As a result, the battery cell VB2, the analog switch CS1 and the analog switch CS2 have the same voltage.

Similarly, the first mode to turn on the pair (c) of the analog switch AS3 and the analog switch BS3 and the second mode to turn on the pair (e) of the analog switch CS1 and the analog switch CS2 are alternately repeated. As a result, the battery cell VB3, the analog switch CS1 and the analog switch CS2 have the same voltage.

And, the first mode to turn on the pair (d) of the analog switch AS4 and the analog switch BS4 and the second mode to turn on the pair (e) of the analog switch CS1 and the analog switch CS2 are alternately repeated. As a result, the battery cell VB4, the analog switch CS1 and the analog switch CS2 have the same voltage.

In the figure, the voltage detection circuit indicated by a broken line has a structure including the aforementioned multiplexer switches, analog switches, and first and second capacitors. Output of the voltage detection circuit 1 is a positive voltage (C2P) of the analog switch CS2. The positive voltage C2P is compared with the reference voltage corresponding to an overcharge voltage, an overdischarge voltage, a capacity adjustment level or the like by comparators CMP1, CMP2, CMP3. The reference voltage is supplied from a reference power circuit 2. The output (C2P) of the voltage detection circuit 1 is transmitted as a detected cell voltage Vx to input of an A/D converter 7, and the analog value of the positive voltage (C2P) is changed to a digital value by the A/D converter 7. The A/D converter 7 can compensate a voltage detection error by the signal given to the aforementioned terminals A1, . . . , A3 and the terminals B1, B2.

The reference power circuit 2 produces a fixed voltage (e.g., 5 V) from the total voltage of the battery cells VB1 to VB4, supplies an electric current to a reference voltage element VR which is disposed outside of the low order control device IC-1 to produce a very accurate voltage than the previous constant voltage and takes the voltage from a terminal Vref-1 into the low order control device IC-1. The voltage input from the terminal Vref-1 is divided into several kinds of voltages, which are then used as the reference voltages according to the comparators CMP1, CMP2, CMP3. A clock generator 5 produces a clock by an oscillator CZ disposed outside of the low order control device IC-1 and uses it in the logic circuit 3 or the like. Detailed structures of an input circuit 4 and an output circuit 6 will be described later with reference to FIG. 3 and FIG. 4.

Then, a first structure of the output circuit 6 and input circuit 4 used for the low order control device in the battery apparatus according to the embodiment will be described with reference to FIG. 3.

Figure 3:
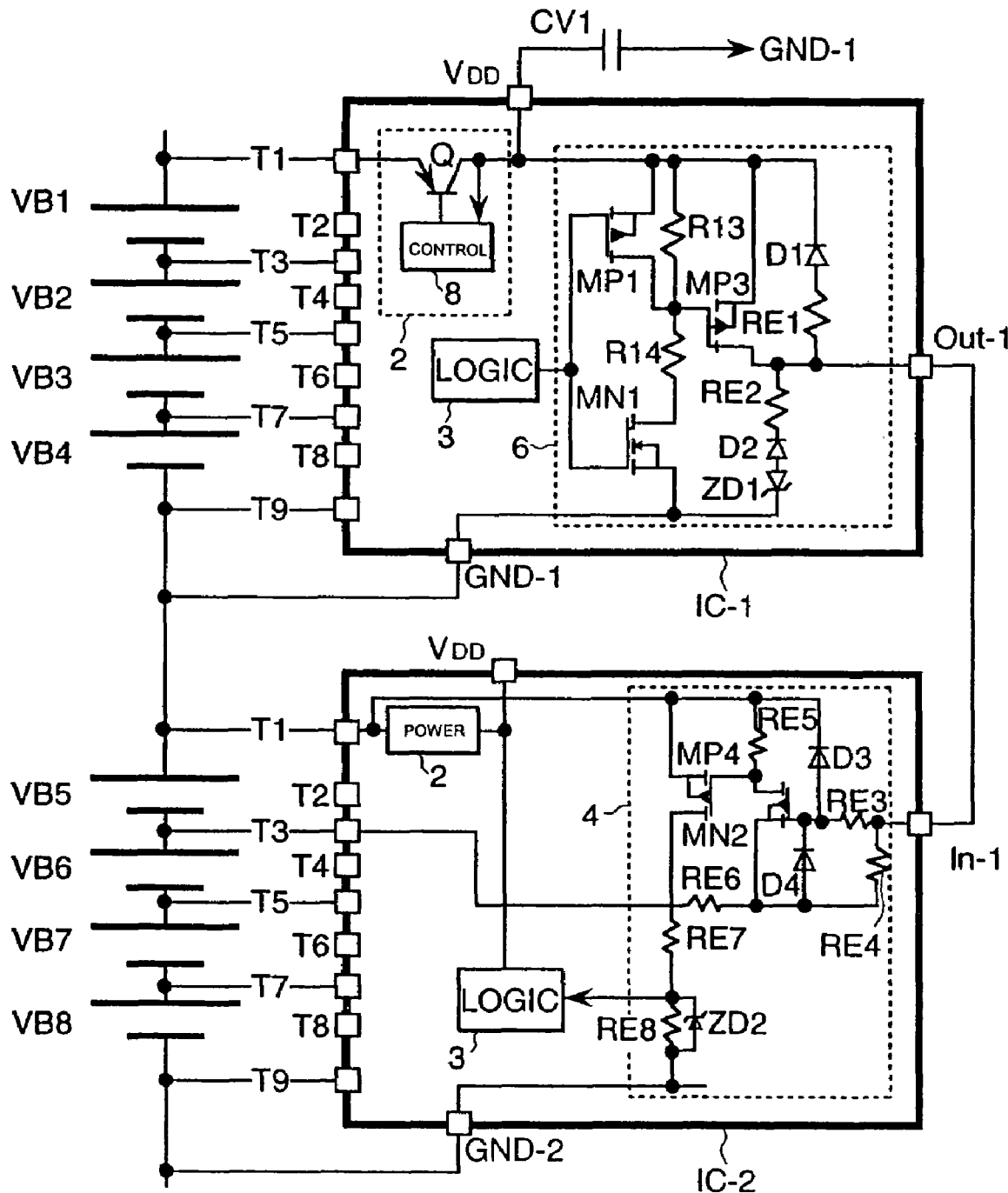
FIG. 3 is a circuit diagram showing a first structure example of an output circuit 6 and an input circuit 4 used for the low order control device in the battery apparatus according to one embodiment of the invention.

FIG. 3 is a circuit diagram showing the first structure of the output circuit 6 and the input circuit 4 used for the low order control device in the battery apparatus according to one embodiment of the invention. FIG. 3 shows details of the output circuit 6 of the low order control device IC-1 and the input circuit 4 of the low order control device IC-2. Like reference numerals are used to indicate like components to those shown in FIG. 1 and FIG. 2.

A transistor Q in a power circuit 2 has a base electric current controlled by a power control circuit 8 to output a fixed voltage to a terminal VDD and supplies the fixed voltage to the output circuit 6.

The output circuit 6 is disposed between the terminal VDD and the GND-1 of the low order control device IC-1 and has a complementary switch comprised of P-MOSFET (MP1) and N-MOSFET (MN1). A resistor R14 is connected between the P-MOSFET (MP1) and the N-MOSFET (MN1). And, the P-MOSFET (MP1) is connected with a resistor R13 in parallel. Output of the complementary switch is applied to a gate terminal of P-MOSFET (MP3).

Here, when the P-MOSFET (MP1) is turned on by a signal output from the logic circuit 3, a short-circuit is caused between the gate and the source of the P-MOSFET (MP3) to turn off the P-MOSFET (MP3). And, when the N-MOSFET (MN1) is turned on, voltages which are resulted from the division of the voltage of the terminal VDD by the resistor R13 and the resistor R14, and voltages at both ends of the resistor R13 are applied between the gate and the source of the P-MOSFET (MP3). The voltages at both ends of the resistor R13 are set to be larger than a gate threshold voltage of the P-MOSFET (MP3) and turn on the P-MOSFET (MP3) but set to be slightly larger than a gate threshold voltage to suppress an output electric current of the P-MOSFET (MP3) (about 1V or 2V higher than a threshold voltage).

As a result, the P-MOSFET (MP3) operates as a fixed current switch and passes the output fixed electric current to the input circuit 4 of the low order control device IC-2. An electrostatic breakdown prevention circuit which has a diode D1 and a resistor RE1 connected in series is disposed between the output terminal of the P-MOSFET (MP) and the terminal VDD, and, when a serge voltage is input from the outside to the output terminal Out-1, the serge voltage is bypassed to the terminal VDD and a capacitor CV1 connected to the terminal VDD via the resistor RE1 and the diode D1. Thus, the electrostatic breakdown between the gate and the source of the P-MOSFET (MP3) due to the serge voltage can be prevented. And, a resistor RE2 and a diode D2 are also provided between the output terminal and GND-1 of the P-MOSFET (MP3) as measures for an electrostatic breakdown, and a zener diode ZD1 is additionally connected in series.

As shown in the drawing, when I/O terminals of the two low order control devices IC-1, IC-2 are connected without isolating, an electric current path, which starts from the output terminal Out-1 and returns to GND-1 via the input terminal In-1 and the battery cell connected to the low order control device IC-2, is formed when P-MOSFET (MP3) is off, and the battery cell is discharged. When the state is left as it is, the battery cell is overdischarged. Therefore, the zener diode ZD1 having a breakdown voltage higher than the battery cell voltage is disposed on the above electric current path to interrupt the discharge current.

Then, the structure of the input circuit 4 will be described. The input terminal In-1 of the low order control device IC-2 is connected to the negative electrode of the battery cell VB5 through the series connection of a resistor RE4 and a resistor RE6. Therefore, the reference potential of the input terminal In-1 is a negative potential of the battery cell VB5 higher than GND-2. The gate terminal of N-MOSFET (MN2) is connected to the input terminal In-1 via a resistor RE3, and the source terminal of N-MOSFET (MN2) is also connected to the negative electrode of the battery cell VB5 via the resistor RE6. A diode D3 is disposed between the gate terminal of the N-MOSFET (MN2) and the positive electrode of the battery cell VB5, and a diode D4 is disposed between the gate terminal and the source terminal of the N-MOSFET (MN2) in order to prevent an electrostatic breakdown. By configuring in this way, the N-MOSFET (MN2) has a reference potential which becomes a negative potential of the battery cell VB5 higher than the GND-2.

A resistor RE5 is disposed between the drain terminal of the N-MOSFET (MN2) and the positive electrode of the battery cell VB5, and voltages at both ends of the resistor 5 are applied between the gate and the source of the P-MOSFET (MP4). The drain terminal of the P-MOSFET (MN4) is connected to GND-2 through the series connection of resistors RE7, RE8. And, a zener diode ZD2 is disposed in parallel to the resistor RE8, and voltages at both ends of the resistor RE8 are transmitted to the logic circuit 3.

The input circuit 4 configured as described above is a circuit which converts a potential in the multiple steps. Specifically, a fixed electric current output by the P-MOSFET (MP3) of the low order control device IC-1 is received by the N-MOSFET (MN2) which has the negative electrode of the battery cell VB5 as the potential reference, and when the N-MOSFET (MN2) is turned on, the P-MOSFET (MP4) is turned on with a voltage produced in the resistor RE5, and a signal voltage is produced at both ends of the resistor RE8 with an electric current passing through the P-MOSFET (MP4) and transmitted to the logic circuit.

A general circuit, particularly an integrated circuit, has an input terminal with the ground as the reference potential and an output terminal. Meanwhile, the low order control device of this embodiment has output connected to a fixed electric current and input connected to a reference potential higher than the ground of the circuit and converts the potential in the multiple steps by the output circuit. Such a configuration is necessary to connect the control devices without isolating. The prevention of the discharge of the battery cell by the zener diode ZD1 was described above. And, when the potential standard of the input terminal In-1 is selected at the ground GND-2, the battery cells VB5, . . . , VB8 constitute a route which runs to discharge from the output terminal Out-1 of the low order control device IC-1 via the input terminal In-1 of the low order control device IC-2 while the P-MOSFET (MP3) is off. In order to interrupt the discharge current, it is necessary to increase a breakdown voltage of the zener diode. And, as a voltage between the source and the drain of the P-MOSFET (MP3), a total voltage of the battery cells VB5, . . . , VB8 is applied, so that a voltage stress is always applied to the P-MOSFET (MP3). In view of the above points, it is desired that the reference potential of the input terminal In-1 is selected to be high and the breakdown voltage of the zener diode ZD1 is set low so to reduce a voltage stress of the P-MOSFET (MP3).

As described above, the discharge current route is formed between the output terminal of the low order control device and the battery cells in the battery module on the low potential side. Specifically, between the output terminal Out-1 of the low order control device IC-1 and the battery cell VB6 in the battery module (comprised of the battery cells VB5, VB6, VB7, VB8) on the potential side lower than the low order control device IC-1, there is formed a discharge current route connecting the output terminal Out-1 of the low order control device IC-1, input terminal In-1 of the low order control device IC-2, the resistor RE3, the diode D4, the positive electrode of the battery cell VB6, the negative electrode of the battery cell VB5, the positive electrode of the battery cell VB5, the ground GND-1 of the low order control device IC-1, the zener diode ZD1, the diode D2, the resistor RE2, and the output terminal Out-1 of the low order control device IC-1. Therefore, this embodiment has interception elements such as the zener diode ZD1, the diodes D2, D4 and the like disposed on this discharge current route in order to prevent the discharge of the batteries.

Then, a second structure example of the output circuit 6 and the input circuit 4 used for the low order control device in the battery apparatus according to this embodiment will be described with reference to FIG. 4.

Figure 4:
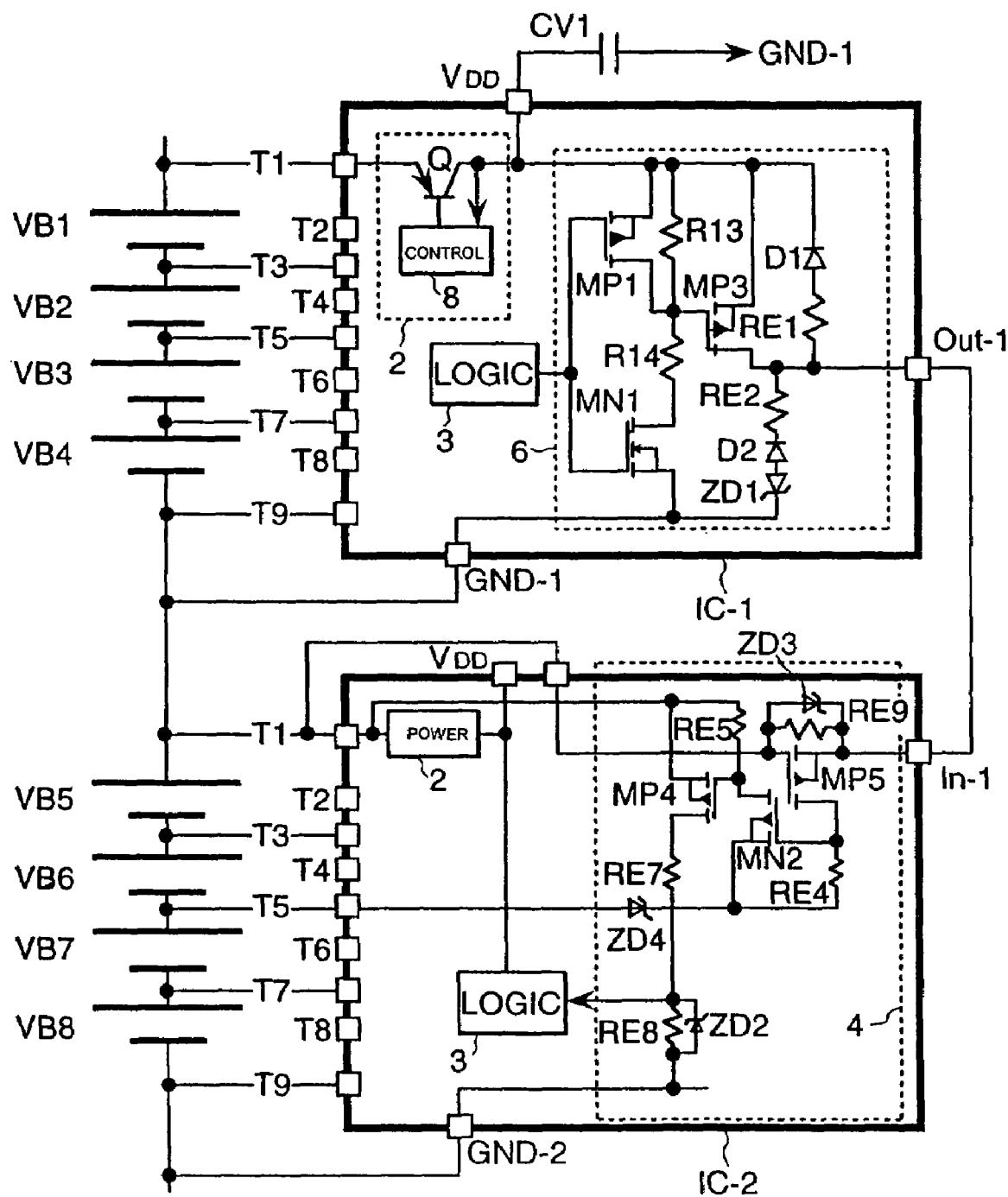
FIG. 4 is a circuit diagram showing a second structure example of the output circuit 6 and the input circuit 4 used for the low order control device in the battery apparatus according to one embodiment of the invention.

FIG. 4 is a circuit diagram showing the second structure example of the output circuit 6 and the input circuit 4 used for the low order control device in the battery apparatus according to one embodiment of the invention. FIG. 3 shows the details of the output circuit 6 of the low order control device IC-1 and the input circuit 4 of the low order control device IC-2. Like reference numerals are used to denote like components to those shown in FIG. 1, FIG. 2 and FIG. 3.

The output circuit 6 of the low order control device IC-1 has the same structure as the output circuit 6 shown in FIG. 3.

The input circuit 4 of the low order control device IC-2 is different from the input circuit shown in FIG. 3 in the following points. Specifically, the source terminal of P-MOSFET (MP5) is connected to the input terminal In-1, the gate terminal of the P-MOSFET (MP5) is connected to the positive electrode of the battery cell VB5. Thus, the reference potential of the input terminal In-1 is selected for the positive electrode voltage of the battery cell VB5 having the same potential as the ground GND-1 of the low order control device IC-1.

The P-MOSFET (MP5) has zener diode ZD3 and resistor RE9 disposed between the source and the gate, and the gate voltage is applied to the P-MOSFET (MP5) with the fixed electric current output by the P-MOSFET. (MP3) to turn on the P-MOSFET (MP5). The drain terminal of the P-MOSFET (MP5) is connected to the negative electrode of the battery cell VB6 via the resistor R4 and the zener diode ZD4. Both end voltages of the resistor RE4 are applied as gate-to-source voltages of the N-MOSFET (MN2). The source terminal of the N-MOSFET (MN2) is also connected to the negative electrode of the battery cell VB6 via the zener diode ZD4. Resistor RE5 is disposed between the drain terminal of the N-MOSFET (MN2) and the positive electrode of the battery cell VB5 to apply both end voltages of the resistor RE5 between the gate and the source of the P-MOSFET (MP4). The drain terminal of the P-MOSFET (MP4) is connected to the ground GND-2 through the series connection of the resistors RE7, RE8. Zener diode ZD2 is disposed in parallel to the resistor RE8 to transmit both end voltages of the resistor RE8 to the logic circuit 3.

According to the above configuration, there is no battery cell on the route running from the output terminal Out-1 of the low order control device IC-1 to the ground GND-1 via the input terminal In-1 of the low order control device IC-2 and the zener diode ZD3, and there is no need to worry about the discharge current of the battery. There is also formed a route running from the input terminal In-1 of the low order control device IC-2 to reach the negative electrode of the battery cell VB6 via the drain and the source of the P-MOSFET (MP5) and the zener diode ZD4 and returning to the ground GND-1 from the battery cell VB6 and the battery cell VB5. When the P-MOSFET (MP3) is off, the P-MOSFET (MP5) is also off, and the battery cells VB5, VB6 do not discharge over this route. A first element which cuts off the discharge current is the P-MOSFET (MP5), and the zener diode ZD4 is tediously used to cut off the discharge current, when the P-MOSFET (MP5) is defective and flows the discharge current.

As described above, by configuring as shown in FIG. 3 or FIG. 4, even if the input and output terminals of the low order control device are connected without isolating, the discharge current of the battery cell can be cut off, and the non-isolating connection can be made. In the examples of FIG. 3 and FIG. 4, the output circuit of the low order control device IC-1 and the input circuit of the low order control device IC-2 are shown by one channel respectively, but they are provided with the same structure in more than one for a single low order control device as shown in FIG. 1.

Then, a method of controlling the battery apparatus according to this embodiment will be described with reference to FIG. 5. Here, contents of control to operate the low order control devices IC-1, . . . , IC3 according to the instruction from the high order control device MPU in the examples shown in FIG. 1 to FIG. 4 will be described.

Figure 5:
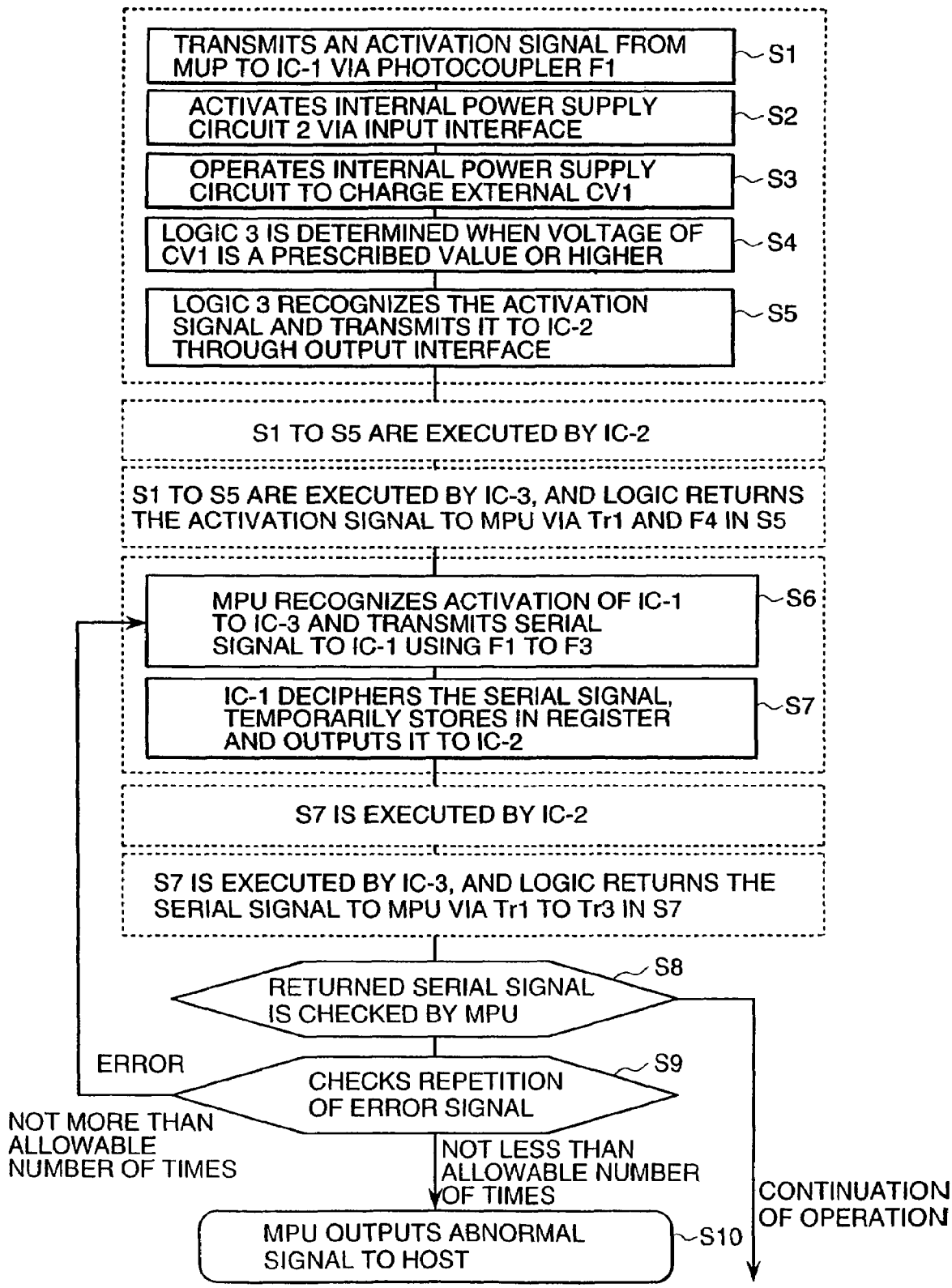
FIG. 5 is a flow chart showing the contents of control of the battery apparatus according to one embodiment of the invention.

FIG. 5 is a flow chart showing the contents of control of the battery apparatus according to one embodiment of the invention.

Here, a flow to make a normal operation after the low order control devices IC-1, . . . , IC-3, which have been in a sleep mode, are activated by the signal from the high order control device MPU will be described.

In step s1, the high order control device MPU transmits an activation signal to the input terminal In-1 of the low order control device IC-1 via the photocoupler F1.

Then, the input circuit 4 of the low order control device IC-1 converts the potential of the signal transmitted to the input terminal In-1 and transmits the signal to the internal power supply circuit 2 in step s2.

Then, the internal power supply circuit 2 operates to control the transistor Q in step s3. It takes time before external capacitor CV1 of the low order control device IC-1 is recharged with the output current of the transistor Q so to have a predetermined voltage VDD.

Then, when the voltage of the capacitor CV1 reaches a prescribed value or higher which is slightly smaller than the voltage VDD in step s4, the logic circuit 3 and also each circuit shown in FIG. 2 are operated. Then, the voltage of CV1 is controlled to the fixed value VDD.

Then, the logic circuit 3 recognizes the activation signal transmitted from the high order control device MPU and transmits it to the low order control device IC-2 having a potential lower by one rank through the output circuit 6 in step s5.

Similarly, the low order control device IC-2 and the low order control device IC-3 are operated by the same flow as in the steps s1, . . . , s5. Besides, the low order control device IC-3 returns the activation signal to the high order control device MPU via the photocoupler F4.

Then, the high order control device MPU recognizes that all the low order control devices IC-1, IC-2, IC-3 are activated from their sleep mode and proceeds to give the next instructions in step s6. Specifically, the high order control device MPU uses photocouplers F1, . . . , F3 and transmits serial type control instructions to the low order control devices IC-1, . . . , IC-3.

Then, the low order control device IC-1 converts the potential of the serial signal obtained from the input terminals In-1, . . . , In-3 by the input circuit 4 and deciphers by the logic circuit 3 in step s7. And, the signal is temporarily stored in the register, and the same serial signal is sent to the next low order control device IC-2.

Subsequently, the low order control devices IC-2, IC-3 also operate in the same way as in the step s7. And, the low order control device IC-3 uses the photocouplers F4, . . . , F6 to return the serial signal to the high order control device MPU.

In step s8, the high order control device MPU checks the returned serial signal and, if it is normal, sends the next control instructions. Meanwhile, if the serial signal returned to the high order control device MPU had an error, the number of errors related to the signal transmission is multiplied in step s9 and, if it is less than an allowable number of times, the same instruction signal is sent to the low order control device IC-1 to perform once again. Meanwhile, if the number of errors has reached the allowable number of times or more, it is determined as abnormal, and the high order control device MPU outputs an abnormal signal to the high order system in step s10.

This control flow has a time delay before the instruction reaches from the low order control devices IC-1 to IC-3. However, a battery voltage change is slower than the operation of the control circuit such as a microcomputer, and the monitoring of the battery cell condition performed by the low order control devices IC-1 to IC-3 may be satisfactory by performing about every tens of ms. Therefore, a time delay caused in the transmission of the signal from the low order control devices IC-1 to IC-3 is not a problem if it is smaller than the state monitoring cycle. Meanwhile, the high order control device MPU can compare the instruction issued to the low order control device IC-1 with the one returned from the low order control device IC-3 to find which of the low order control devices had an error. Particularly, when a signal is sent without isolating, it is worried that there might be an effect due to noise produced by an inverter or the like connected to the secondary battery. But, according to the aforementioned control method, the high order control device MPU can check that each of the instructions is accurately recognized by all the low order control devices, and the reliability of the apparatus can be improved.

Figure 6:
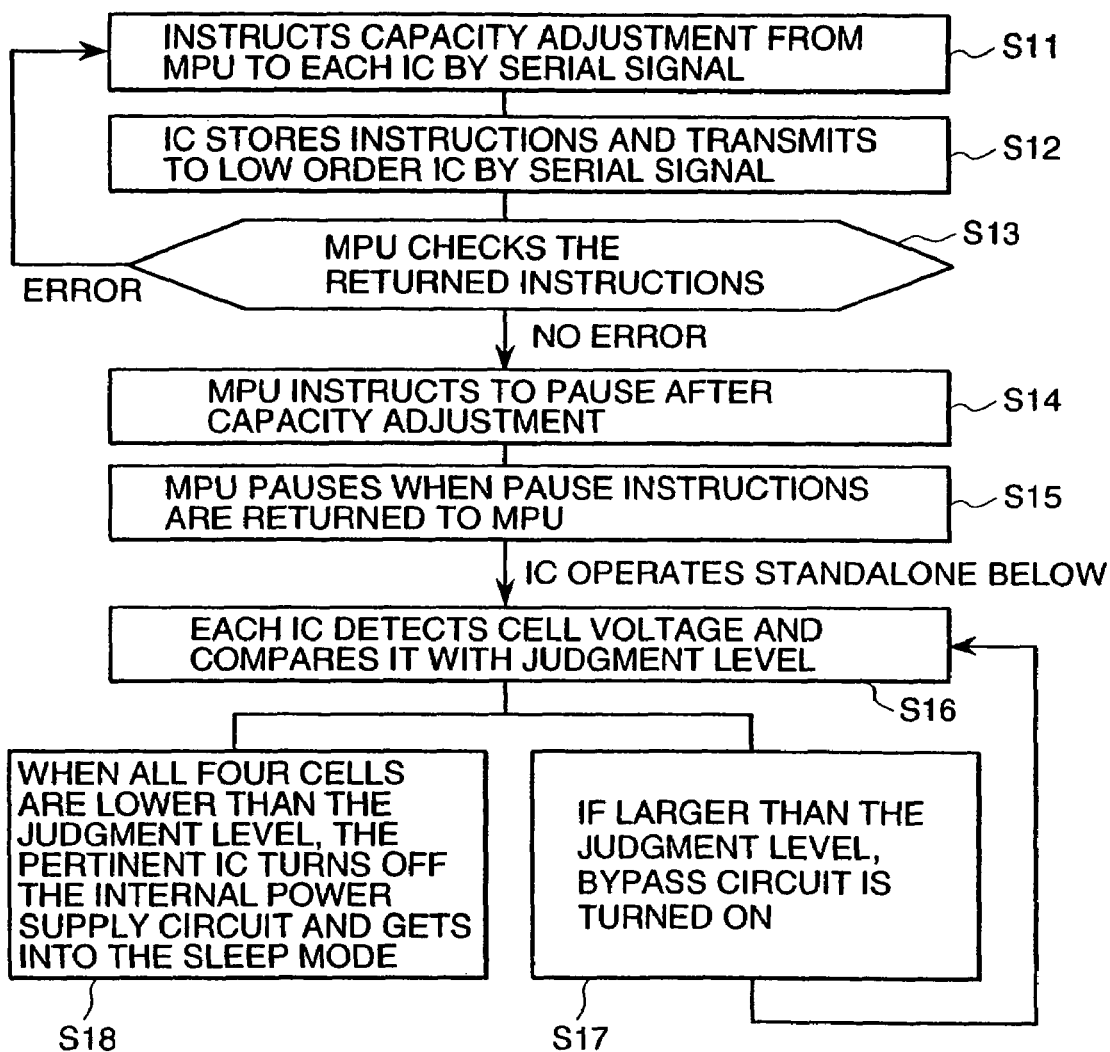
FIG. 6 is a flow chart showing the contents of control to adjust the capacity in the battery apparatus according to one embodiment of the invention.

With reference to FIG. 6, the control method for the capacity adjustment by the battery apparatus according to this embodiment will be described.

FIG. 6 is a flow chart showing the contents of control to adjust the capacity of the battery apparatus according to one embodiment of the present invention.

The high order control device MPU instructs the adjustment of capacity to the low order control devices IC-1, IC-2, IC-3 in step s11.

Then, the low order control devices IC-1, IC-2, IC-3 store the instructions in the register and send the same instructions to a low order control device having a potential lower by one level in step s12. This method is the same as the one shown in FIG. 5.

Then, the high order control device MPU checks the instructions returned from the low order control device IC-3 in step s13 and, if they were normal, proceeds to step s14 but if had an error, returns to step s11 and gives the same instructions again.

If they were normal in step s14, the high order control device MPU sends instructions to the low order control devices IC-1, . . . , IC-3 to go into sleep mode after the capacity adjustment.

Then, the high order control device MPU checks the return of the instructions and gets into the sleep mode in step s15. Then, the low order control devices IC-1, . . . , IC-3 do not receive any instruction from the high order control device MPU and operate in a standalone state, respectively.

Specifically, the low order control devices IC-1, . . . , IC-3 sequentially detect the voltage of the battery cells placed in the corresponding battery module by the voltage detecting circuit 1 of FIG. 2 and compare the detected value with a judgment level (capacity adjusting reference voltage: a voltage output to the comparator CMP3 by the reference voltage circuit 2 of FIG. 2) in step s16.

When the voltage of the battery cells is higher than the judgment level, the switching elements S1, . . . , S12 corresponding to the respective battery cells are turned on in step s17, and the process of step s16 is performed again.

When the voltage of the battery cells becomes lower than the judgment level, the low order control devices IC-1, . . . , IC-3 check that the voltage of the battery cells placed in the corresponding battery module is lower than the judgment value, turn off the internal power supply 2 disposed in the respective devices and get into the sleep mode in step s18. In the standalone state, the sequence of falling into the sleep mode of the low order control devices IC-1, . . . , IC-3 connected in series is not decided. Therefore, it is configured in such a way to prevent disadvantages that an excessive voltage is applied to the fixed current switch MP3 and the battery cells are locally discharged in the non-isolated connection of the input/output between the high and low order devices as shown in FIG. 3 and FIG. 4.

In the above example, the capacity adjusting instructions use a capacity adjusting reference voltage which is previously given to the comparator CMP3 of FIG. 2. But, any voltage instructed by the high order control device MPU can be used as a capacity instruction value by using the A/D converter shown in FIG. 7. In this case, the judgment level in step s16 is any voltage instructed by the high order control device MPU. This point will be described later with reference to FIG. 7.

Then, a structure and operation of the A/D converter used for the battery apparatus according to this embodiment will be described with reference to FIG. 7 to FIG. 10. The A/D converter in this embodiment is provided with a function to calibrate an error of the voltage detecting unit.

First, a general structure of the A/D converter used for the battery apparatus according to this embodiment will be described with reference to FIG. 7 and FIGS. 8A to 8D.

Figure 7:
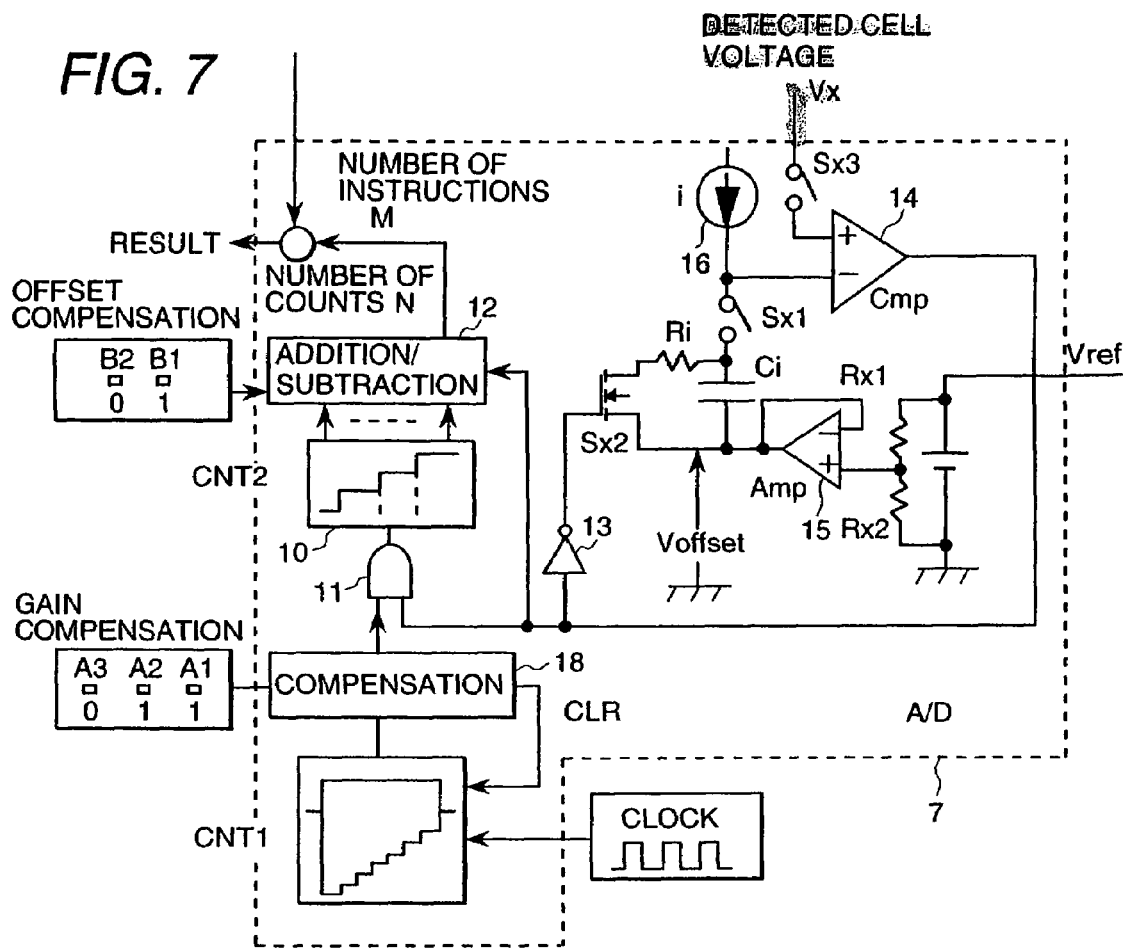
FIG. 7 is a circuit diagram showing a structure of an A/D converter used in the battery apparatus according to one embodiment of the invention.

FIG. 7 is a circuit diagram showing a structure of the A/D converter used for the battery apparatus according to one embodiment of the present invention. FIG. 8A to FIG. 8D are timing charts of the A/D converter used for the battery apparatus according to one embodiment of the invention. Like reference numerals are used to indicate like components parts to those shown in FIG. 1.

As shown in FIG. 1, the A/D converter 7 is provided with compensation terminals A1, . . . , A3 and compensation terminals B1, B2 for compensation of a voltage detection error. Voltage (voltage of C2P) Vx detected by the voltage detecting unit 1 shown in FIG. 2 is transmitted to the positive terminal of a comparator 14 via a switch unit Sx3. Meanwhile, electric current i of the fixed current unit 16 is accumulated in a capacitor Ci via a switch unit Sx1 which is driven in synchronization with the switch unit Sx3. A total voltage of the voltage of the capacitor Ci and an adjustment voltage (Voffset) output by an amplifier 15 is applied to the negative terminal of the comparator 14 and compared with the detected-voltage Vx. The capacitor Ci, after the voltage of the battery cell is measured once, is discharged by a discharge circuit of a switch unit Sx2 driven by a logic inverter 13 and a resistor Ri. Specifically, when the switch unit Sx3 is turned on and the detected voltage Vx is transmitted to the positive terminal of the comparator 14, the capacitor Ci has a voltage of zero, and the voltage at the negative terminal of the comparator 14 is equal to the adjustment voltage (Voffset). The switch unit Sx2 remains in the off state from the time when the switch unit Sx1 and the switch unit Sx3 are turned on. Therefore, after the time when the switch unit Sx1 and the switch unit Sx3 are turned on, the voltage of the capacitor Ci is integrated with the electric current i to increase with time.

Output of the comparator 14 changes from "1" to "0" when a voltage resulting from a sum of the voltage of the capacitor Ci and the adjustment voltage (Voffset) is higher than the voltage Vx of the electric current to be detected. The A/D converter 7 performs integration type detection for measuring a duration in which the output of the comparator 14 changes to "0" from the time when the switch unit Sx1 and the switch unit Sx3 are turned on.

Using the adjustment voltage (Voffset) depends on the relation between the battery remaining capacity and voltage. For example, a lithium-ion battery using amorphous carbon has a battery cell voltage (open-circuit voltage) of about 2.9 V when the remaining capacity is 0% and an open-circuit voltage is about 4.1 V when the capacity is 100%. For example, the A/D converter 7 is demanded to be able to detect a voltage ranging from 2.9 V to 4.1 V accurately, but a voltage at a time when the remaining capacity is 0% or below is excluded from the measurement. Therefore, a voltage (e.g., 2 V) when the remaining capacity is 0% or less is selected as an adjustment voltage (Voffset) so to enable to detect a voltage which is equal to or higher than the adjustment voltage with high accuracy. Here, the adjustment voltage is a voltage which is obtained by dividing the value of the reference voltage Vref shown in FIG. 2 by resistance Rx1, Rx2 and multiplying the obtained value with the gain of the amplifier 15.

Figure 8A:
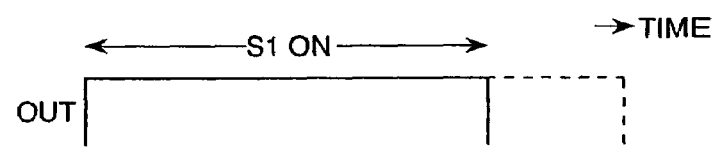
FIGS. 8A to 8D are timing charts of the A/D converter used in the battery apparatus according to one embodiment of the invention.

A duration from the time when the switch unit Sx1 and the switch unit Sx3 are turned on to the time when output of the comparator 14 becomes 0 is measured as follows. First, a clock pulse is frequency divided by the first counter 9. It is assumed that the clock pulse shown in FIG. 8D has a frequency of 10 MHz and counted for 128 for example, and a signal of a half cycle shown in FIG. 8A is produced. The number of counts is different depending on whether the compensation terminals A1, . . . , A3 are "1" or "0", and FIG. 8A to FIG. 8D show an example that compensation of ±3 pulses can be made with respect to the standard 128 pulses. Details of the compensation will be described later with reference to FIG. 9.

Figure 8B:
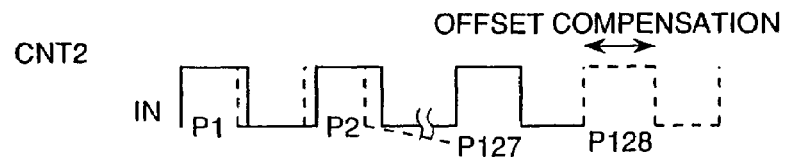
Figure 8C:
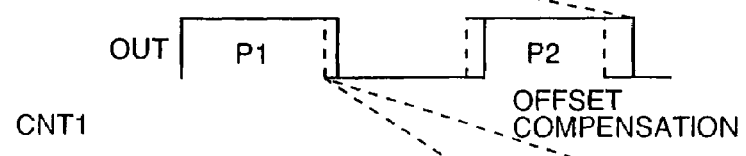
Figure 8D:
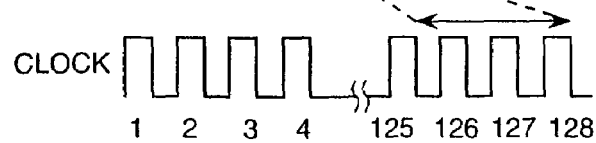

In FIG. 7, when output of the comparator 14 is 1, an AND circuit 11 transmits the pulse which is frequency divided by the first counter 9 to the next second counter 10. The second counter 10 counts the output of the first counter 9 until the output of the comparator 14 becomes 0 as shown in FIG. 8C. It is assumed that the voltage of the capacitor Ci not containing the adjustment voltage and falling in a range of 0 V, . . . , 3 V is a full scale, and the number of counts up to 3 V is 128 pulses. Features of the second counter 10 include that a shift register 12 counts ±1 (or 2) for the result of the second counter 10 depending on the state that the compensation terminals B1, B2 are "1" or "0" as shown in FIG. 8B. Output of the shift register 12 is digitally compared with the capacity adjustment level transmitted from the high order control device MPU or used in the role of transmitting the output of the shift register 12 to the high order control device MPU.

Here, the compensation by the first counter 9 according to the compensation terminals A1, . . . , A3 is to compensate the voltage value of the capacitor Ci which is determined depending on the values of the constant current i and the capacitor Ci and corresponds to the gain compensation. Compensation of the second counter 10 by the compensation terminals B1, B2 is to compensate the adjustment voltage which is output of the amplifier 15 and corresponds to the offset compensation.

When it is assumed that the clock frequency is 10 MHz, the number of counts by the first counter 9 is 128 and the number of counts by the second counter is 128 in full scale as described above, and it takes time of about 1.1 ms when the battery cell has a voltage of 4 V. Therefore, the number of counts by the first and second counters may be changed depending on the desired accuracy of voltage detection and measurement time.

The compensation terminals A1, A2, A3, B1, B2 of the A/D converter 7 are provided to calibrate the accuracy of the reference voltage source which is separately provided for the low order control devices IC-1, . . . , IC-3 which are connected in series. Therefore, errors of the fixed current i, the capacitor Ci and the adjustment voltage (Voffset) are previously detected for each of the low order control devices IC-1, . . . , IC-3, and information "1" or "0" is given to the terminals A1, . . . , A3 and the terminals B1, B2 to compensate such errors. This "1" or "0" can be set by connecting the respective terminals to the VDD or the GND-1 as described above, and a special device such as a laser trimmer of resistance is not required.

Then, structures and operations of the first counter 9 and the second counter 10 in the A/D converter used for the battery apparatus according to this embodiment will be described with reference to FIG. 9 and FIG. 10.

Figures 9, 10:
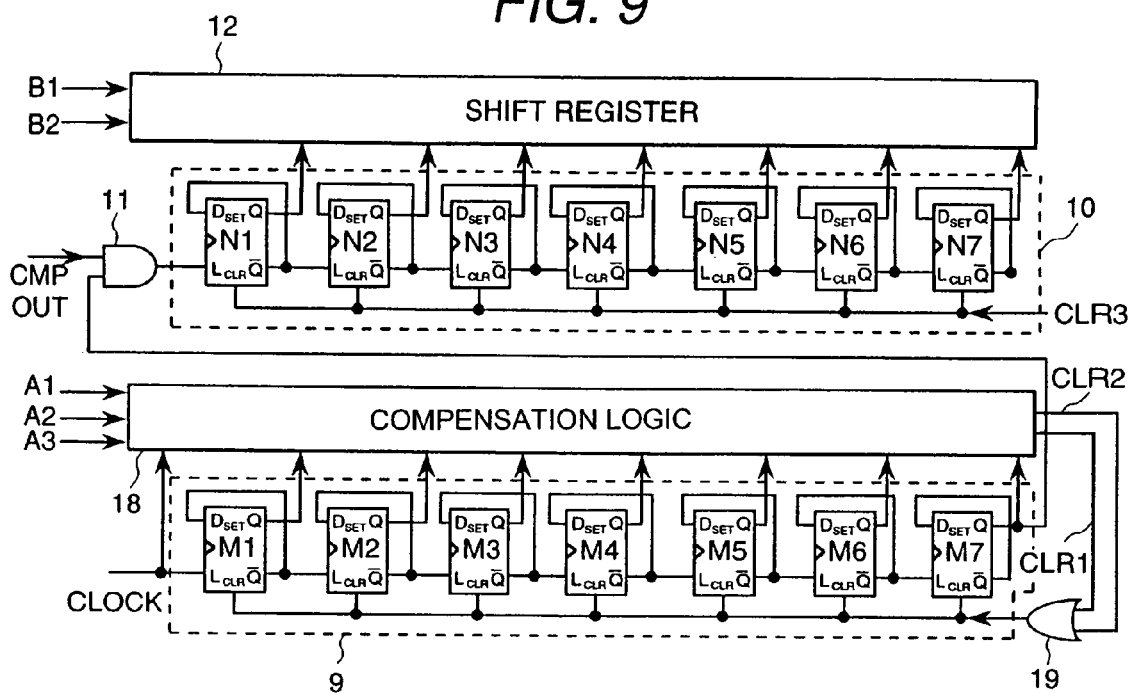
FIG. 9 is a circuit diagram showing a structure of a first counter 9 and a second counter 10 in the A/D converter used in the battery apparatus according to one embodiment of the invention.
FIG. 10 is a truth table of the A/D converter used in the battery apparatus according to one embodiment of the invention.

FIG. 9 is a circuit diagram showing the structures of the first counter 9 and the second counter 10 in the A/D converter used for the battery apparatus according to one embodiment of the invention. FIG. 10 is a truth table of the A/D converter used for the battery apparatus according to one embodiment of the invention. Like reference numerals are used to indicate like component parts to those shown in FIG. 7.

The counters 9, 10 shown have a structure corresponding to 128 counts. The first counter 9 is provided with flip-flops M1, . . . , M7 and inputs output of the respective flip-flops to a compensation logic 18. The compensation logic 18 can change the cycle of the frequency division by ±3 pulses depending on the states of the compensation terminals A1, . . . , A3. The compensation logic 18 is the truth table shown in FIG. 10 which is prepared in the form of a logical circuit or software. The cycle that the flip-flops M1, . . . , M7 are cleared is variable depending on the output of the compensation logic 18, and a pulse which has the cycle to the clearness as a half cycle is sent to the second counter 10 which is comprised of flip-flops N1, . . . , N7. The shift register 12 compensates the output of the flip-flops N1, . . . , N7 by ±1 count (or 2 counts) depending on the states of the compensation terminals B1, B2 and outputs.

When it is assumed that a voltage range of the capacitor Ci, which is determined by the comparator 14, is 0, . . . , 3V (0, . . . , 5V in voltage Vx) at full scale, ±1 count compensated by the shift register 12 corresponds to ±23.4 mV. And, a pulse width (input pulse width of the second counter) which is compensated by the compensation logic 18 can be compensated by ±2% if it is ±3 pulses to 128 pulses.

The low order control devices IC-1, IC-2, IC-3 shown in FIG. 1 inspect the accuracy of the voltage detecting unit before shipping of the products, and evaluate the voltage detection accuracy related to the reference voltage error possessed by the respective products. And, the compensation terminals A1, . . . , A3 and B1, B2 are used for each low order control device to calibrate so that the voltage detection accuracy falls in the allowable range. Thus, it is not necessary to provide high-cost high precision parts for the reference voltage to achieve both high accuracy and low-cost of the device.

As described above, the quantity of isolating units can be reduced, and a low-cost control device can be provided according to this embodiment.

It is also possible to reduce an influence caused by disturbance such as noise and to make the signal transmission with improved reliability.

Besides, the high accurate voltage detection can be achieved, and it is possible to make cost reduction.

Then, the battery apparatus according to another embodiment of the invention will be described with reference to FIG. 11.

Figure 11:
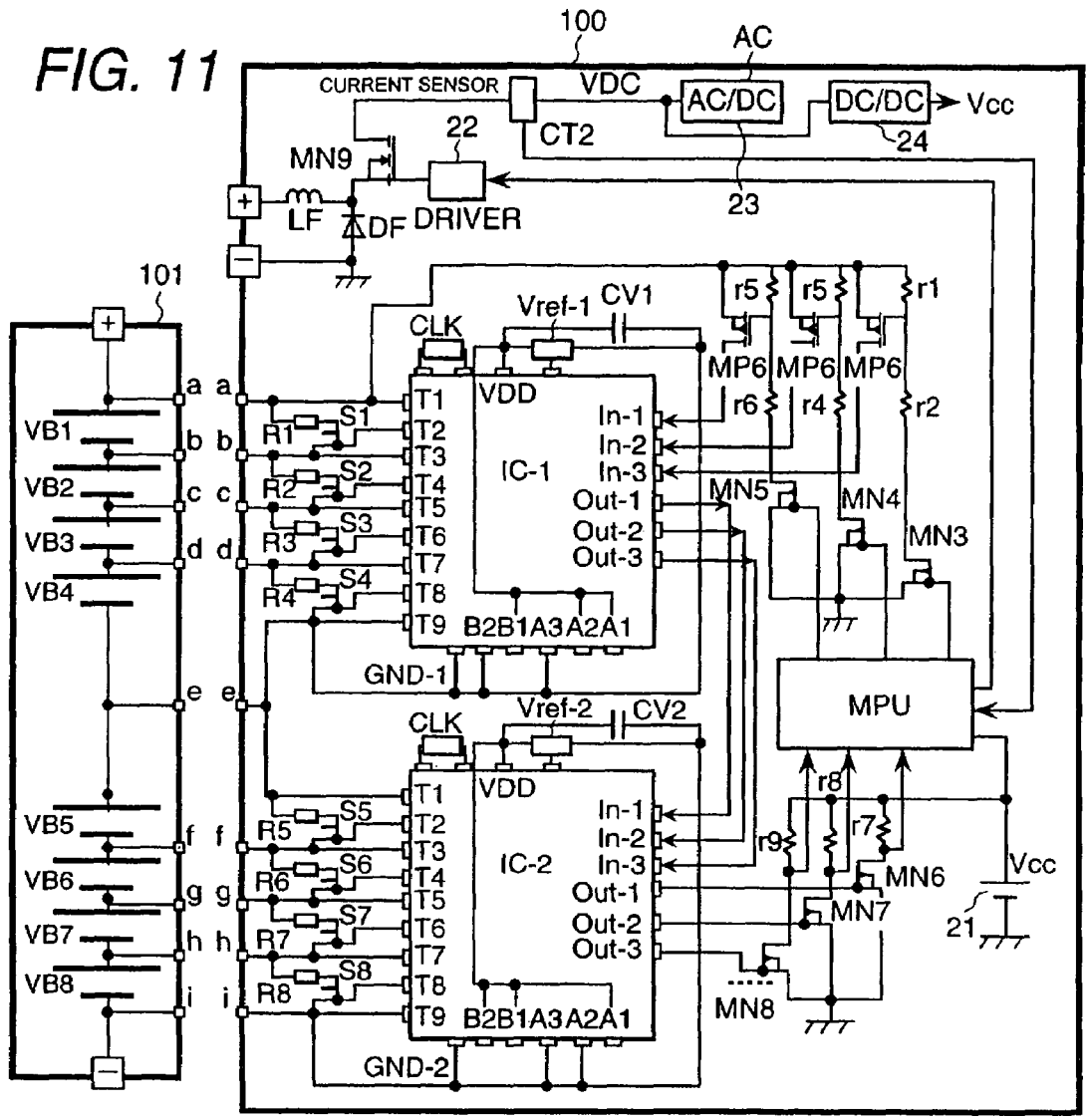
FIG. 11 is a circuit diagram showing a general structure of the battery apparatus according to another embodiment of the present invention.

FIG. 11 is a circuit diagram showing a general structure of the battery apparatus according to another embodiment of the invention.

The battery apparatus according to this embodiment has low order control devices IC-1, IC-2 and a high order control device housed in a charger package 100. Electric cells VB1 to VB4 and battery cells VB5 to VB8 which configure battery modules are housed in a battery module 101 separate from the charger package 100.

Conventionally, mobile equipment has a control device (equivalent to the low order control devices IC-1, IC-2) for detecting a trouble of batteries mounted in a battery module. Meanwhile, a nickel hydrogen or lithium battery used for hybrid electric cars is a high power type battery which can discharge and recharge an electric current of several, . . . , tens of times of a rated electric current in a short time. Such a high power type battery is expected to be applied for civilian use (e.g., power tools, cordless cleaners, etc.) other than automobiles. For example, a power tool is demanded to have a function to discharge an electric current of about ten times of a battery rating and to recharge quickly with an electric current of several times of a rated current. When an electric current of about ten times of the battery rating is discharged, the voltage detecting unit of the control device detects a voltage which is obtained by synthesizing an open-circuit voltage (a voltage when a load is not connected to the battery) related to the remaining capacity of the battery and a dropped portion of the voltage which is determined by the product of the internal resistance of the battery and a large current. When the synthesized voltage drops to an overdischarge level or less, it is determined as an overdischarge by the detecting circuit, and the apparatus stops. But, the high power type battery is free from any trouble in view of safety even if the synthesized voltage drops to the overdischarge level or less in a short time. The power tool is required to have a battery light-weighted and cost reduced. Therefore, if there is no obstacle on safety, the control device (such as an IC) related to the protection of the battery is fitted on a charger separate from the battery module to monitor the battery for its abnormality by only a simple temperature detecting unit such as a thermistor when the tool is being used, and if a temperature around the battery exceeds an allowable value, an electric current may be shut off on the side of a battery load such as a motor. The above battery uses are taken into consideration in this embodiment.

In the example shown in FIG. 11, the battery module 101 accommodates eight battery cells connected in series. Within the charger 100, the two low order control devices IC-1, IC-2 shown in FIG. 2 are disposed in series. The peripheral equipment of the low order control devices IC-1, CI-2, namely a capacity adjusting switch, a resistor, a clock oscillator and reference voltage parts, have the same structure as those shown in FIG. 1. Voltage detection compensating terminals A1, A2, A3, B1, B2 are also the same as in FIG. 1.

A difference from FIG. 1 is a method of connecting the high order control device MPU and the low order control devices IC-1, IC-2, and an isolating photocoupler is not used but a potential conversion unit using a switching element is provided in this embodiment. Specifically, the potential conversion unit which transmits a signal from the high order control device MPU to the low order control device IC-1 on the high potential side are provided with N-MOSFET (MN3), (MN4), (MN5) to which a gate signal is input from the high order control device MPU. These switch units are respectively connected to a series resistor comprising the resistors r1 and r2, the resistors r3 and r4, and the resistors r5 and r6. Here, the resistors r1, r2, r3 have one end connected to the positive electrode of the battery cell VB1 in the highest potential. Voltages of the resistors r1, r2, r3 are connected to gates of the P-MOSFET (MP6), (MP7), (MP8), and when the N-MOSFET (MN3), (MN4), MN5) are turned on or off, the P-MOSFET (MP6), (MP7), (MP8) are also turned on or off accordingly. The drain terminals of the P-MOSFET (MP6), (MP7), (MP8) are coupled to the input terminals In-1, In-2, In-3 of the low order control device IC-1, respectively.

Similarly, a unit for potential conversion of a signal returning from the low order control device IC-2 on the low potential side to the high order control device MPU is provided with N-MOSFET (MN6), (MN7), (MN8) of which gates are respectively connected to the output terminals Out-1, Out-2, Out-3 of the low order control device IC-3, and resisters r7, r8, r9 are connected between the drain terminals of the N-MOSFET (MN6), (MN7), (MN8) and the positive electrode of a control power supply 21 (Vcc). And, the voltages of the resistors r7, r8, r9 return to the high order control device MPU. The high order control device MPU also sends a signal to a recharge controlling circuit. Specifically, a recharging circuit is formed of a power MOSFET (MN9) connected to a high voltage power supply VDC, its driver circuit 22, a backflow diode DF connected to the power MOSFET (MN9), and a choking coil LF of which one end is connected to the power MOSFET (MN9). And, an electric current passing from the high voltage power supply VDC to the battery module 101 via the power MOSFET (MN9) is monitored by a current sensor CT2. The high voltage source VDC is produced by an AC/DC converter 23 which is connected to a commercial AC power supply, and output of the VDC is used to produce the control power supply 21 for the high order control device MPU by a DC/DC converter 24.

The respective electrodes of the battery cells placed in the battery module 101 and the corresponding low order control devices IC-1, IC-2 in the charger 100 are connected via terminals a, . . . , i. The positive and negative electrodes of the battery module 101 and the charger 100 are connected to pass a charging current. The charger 100 controls the charging current passing through the power MOSFET (MN9) by a signal output from the high order control device MPU. The low order control devices IC-1, IC-2 perform the capacity adjustment, which was described with reference to FIG. 6, during or after the battery module 101 is recharged. For the capacity adjustment while recharging, when the battery module 101 and the charger 100 are connected, a voltage of each battery cell is measured by the A/D converters mounted on the low order control devices IC-1, IC-2, and the measured values are sequentially sent to the high order control device MPU. The high order control device MPU calculates a capacity adjustment level from the voltage of each battery cell and transmits to the low order control devices IC-1, IC-2. Then, the low order control devices IC-1, IC-2 perform the capacity adjustment and the detection of overcharging while the charging current flows. It is to be noted that the operation to get into sleep mode after the adjustment described in connection with step s18 of FIG. 6 is omitted.

As described above, a low-cost control device can be achieved by decreasing a quantity of isolating units according to this embodiment.

The signal transmission of which reliability is improved can be attained by reducing the influence by the external interference, such as noise.

Besides, the highly accurate voltage detection can be achieved, and the cost reduction can be made.

The method of controlling the battery apparatus according to another embodiment of the present invention will be described with reference to FIG. 12A to FIG. 12D.

FIGS. 12A to 12D are timing charts showing the contents of control in the battery apparatus according to another embodiment of the invention. The structure of the battery apparatus used in this embodiment can be either one shown in FIG. 1 and FIG. 11.

FIGS. 12A to 12D show a transmitting method of I/O data which is sent from the high order control device MPU to the low order control device IC-1 or among the low order control devices IC-1, IC-2, IC-3.

Figure 12A:
FIGS. 12A to 12D are timing charts showing the contents of control of the battery apparatus according to another embodiment of the invention.
Figure 12B:
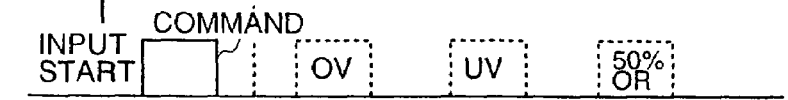
Figure 12C:
Figure 12D:
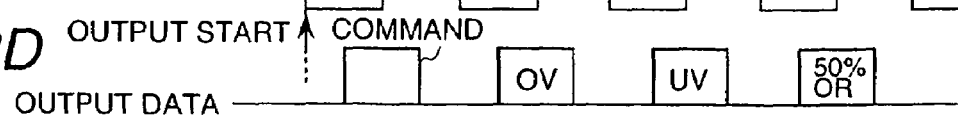

The high order control device MPU transmits the clock signal shown in FIG. 12A and input data (FIG. 12B) in synchronization with the clock signal to the low order control device IC-1 in the highest potential. And, data input from the high potential side to the low potential side is serial transmitted among the low order control devices IC-1, . . . , IC-3. In other words, the low order control device which has received the input clock and input data outputs the same signal with shifting by one clock as shown in FIGS. 12C, 12D.

Thus, signal delay time between the input and output of the signal can be shortened. In FIGS. 12B and 12D, OV, UV and 50% OR indicated by the broken line indicate overcharge, overdischarge and capacity adjustment judging bits. When the input data received from the high potential side higher by one level has information on the OV, UV and 50% OR, it is indicated by the solid line in FIG. 12, but if not, it is indicated by the broken line. In the output data, 50% OR is indicated by the solid line, and it means that there was an battery cell exceeding the capacity adjustment level as the result of detecting the voltage of the battery cells (e.g., the battery cells VB1, . . . , VB4) to which the low order control device having received the input data corresponds. Thus, the low order control device takes logical add (OR) of the data input about the overcharge, overdischarge and capacity adjustment judgment and the detected result of the corresponding battery cells, and transmits the result to the low order control device.

The high order control device MPU can check that at least one among all the battery cells exceeds the judgment level if the returned data had any flag of the OV, UV, 50% OR stood.

By having the aforementioned serial signal, when the plural low order control devices are connected without isolating, a signal transmission delay is short, and a fail safe type is provided by virtue of the OR form, and reliability is improved. When a logical product is used instead of the logical add, the variation in battery voltage can be presumed from the analysis of a signal when recharging or discharging, and the capacity adjusting function can be operated according to the detected result.

In the embodiments shown in FIG. 1 to FIGS. 12A to 12D, the battery cells VB1, . . . , VB12 are assumed to be the secondary batteries, but they are not limitative and may be an ultra capacitor.

According to the present invention, a quantity of isolating units is decreased, and the cost reduction of the control device can be made.

And, the influence by the external interference such as noise is reduced, and the signal transmission with reliability improved can be realized.

Besides, highly accurate voltage detection can be achieved, and the cost reduction can be made.

It should be further understood by those skilled in the art that the foregoing description has been made on embodiments of the invention and that various changes and modifications may be made in the invention without departing from the spirit of the invention and scope of the appended claims.

What is claimed is:

1. A battery apparatus comprising:
   plural battery modules each having plural battery cells, said plural battery modules being connected in series; and
   plural first control devices, being provided corresponding to the plural battery modules, to receive a command signal which is transmitted from a second control device through an isolator and detect a status of the plural battery cells which are included in a corresponding battery module, wherein
   the plural first control devices are integrated circuits having input and output signal circuits, voltage detecting circuits, input signal terminals, output signal terminals, and detecting terminals, said input and output signal circuits receiving a signal through said input signal terminals and sending a signal through said output signal terminals, and said voltage detecting circuits detecting a voltage of each of the corresponding plural battery cells through said detecting terminals, and
   said integrated circuits have different reference potentials, and are connected in series by connecting said output signal terminals and said input signal terminals between the serially connected integrated circuits which are connected in an electrically non-isolated manner.

2. A battery apparatus used for a vehicle, the battery apparatus comprising:
   plural battery modules each having plural battery cells, said plural battery modules being connected in series; and
   plural first control devices, being provided corresponding to the plural battery modules, to receive a command signal from a second control device and detect a status of the plural battery cells which are included in a corresponding battery module, wherein
   the plural first control devices include input and output signal circuits, said input and output signal circuits having different reference potentials;
   the plural first control devices are connected in series by connecting output signal terminals of said output signal circuits and input signal terminals between the first control devices in an electrically non-isolated state; and
   said serially connected first control devices receive the command signal from the second control device through an isolator.

3. A battery apparatus used for a vehicle, the battery apparatus comprising:
   plural battery modules each having plural battery cells, said plural battery modules being connected in series; and
   plural first control devices, being provided corresponding to the plural battery modules, to receive a command signal from a second control device and control the plural battery cells which are included in a corresponding battery module, wherein
   the plural first control devices include input and output signal circuits with output signal terminals and input signal terminals therein;
   the plural first control devices are connected in series by a communication line;
   output signals from said output signal terminals have different reference potentials from each other according to the reference potential of the corresponding first control device; and
   wherein said communication line receives the command signal, through an isolator, from the second control device, and transmits the command signal to the plural first control devices that are not electrically isolated.

4. The battery apparatus according to one of claims 1-3, wherein a signal for each of the first control devices is transmitted to said each of the first control devices through said series of said plural input and output signal circuits.

5. The battery apparatus according to claim 4, wherein the signal for each of the first control devices is transmitted from the input and output signal circuit of the first control device corresponding to a highest potential battery module toward the input and output signal circuit of the first control device corresponding to a lowest potential battery module, sequentially.

6. The battery apparatus according to claim 5, wherein the isolator is connected to a signal input side of the input and output signal circuit of the first control device corresponding to the highest potential battery module, and the signal transmitted from the second control device is inputted into the signal input side of the input and output signal circuit of the first control device corresponding to the highest potential battery module.

7. The battery apparatus according to claim 1, wherein each of the integrated circuits has a plurality of terminals, the plurality of terminals includes terminals respectively coupled to the plural battery cells of the corresponding battery module and other terminals, and the terminals coupled to the battery cells and the other terminals are alternatively disposed.

8. The battery apparatus according to claim 2 or 3, wherein each of the plural first control devices are integrated circuits having a plurality of terminals, the plurality of terminals includes terminals respectively coupled to the plural battery cells of the corresponding battery module and other terminals, and the terminals coupled to the battery cells and the other terminals are alternatively disposed.

9. The battery apparatus according to claim 6, wherein the plural first control devices send and receive a signal from the second control device, and wherein the signal transmission is carried out between the second control device and the highest reference potential first control device, and also between the second control device and the lowest reference potential first control device, and the transmission is carried out by electrical connection among the plural first control devices.

10. The battery apparatus according to one of claims 1 to 3, wherein the isolator is provided for the signal transmission path between the first control device corresponding to a highest reference potential battery module and the second control device.

11. The battery apparatus according to claim 10, wherein the isolator is provided for the signal transmission path between the first control device corresponding to a lowest reference potential battery module and the second control device.

12. The battery apparatus according to one of claims 1-3, wherein a discharge circuit, having a switch and resistor, is connected in parallel between a positive pole and a negative pole of at least one of the battery cells.

13. The battery apparatus according to claim 12, wherein the plural first control devices send and receive a signal to/from the second control device, and the plural first control devices transmit voltage information of the battery cells in the corresponding battery module to the second control device, receive discharge command signal transmitted from the second control device, control the switch in the discharge circuit in accordance with the discharge command signal, and control discharge of the battery cells in the corresponding battery module.

14. The battery apparatus according to claim 12, wherein the plural first control devices send and receive a signal to/from the second control device, and the plural first control devices generate a discharge level in the battery cells in the corresponding battery module, control the switch in the discharge circuit provided in the battery cells in the corresponding battery module, and a discharge of the battery cells in the corresponding battery module.

15. The battery apparatus according to one of claims 1-3, wherein the isolator includes a photo-coupler.

16. The battery apparatus according to one of claims 1-3, wherein the battery cells are lithium electrical cells.

17. The battery apparatus according to one of claims 1-3, wherein power for the plural first control devices is supplied by a first power supply, and wherein power for the second control device is supplied by a second power supply, said second power supply being different than said first power supply.

18. The battery apparatus according to one of claims 1-3, wherein a voltage detection signal or the command signal is transmitted between said first control devices and said second control device through first and second signal lines, and wherein the first signal line is connected between the plural first control devices and the isolator, and wherein the second signal line is connected between the isolator and the second control device, and a ground level of the voltage detection signal or the command signal in the first signal line is different from a ground level of the voltage detection signal or the command signal in the second signal line.

19. The battery apparatus according to claim 17, wherein a voltage detection signal or the command signal is transmitted between said first control devices and said second control device through first and second signal lines, and wherein the first signal line is connected between the plural first control devices and the isolator, and wherein the second signal line is connected between the isolator and the second control device, and a ground level of the voltage detection signal or the command signal in the first signal line is different from a ground level of the voltage detection signal or the command signal in the second signal line.

20. A battery apparatus comprising:

plural battery modules each having plural battery cells, said plural battery modules being connected in series; and a group of first control devices, corresponding to the plural battery modules, wherein said group receives a command signal which is transmitted from a second control device through an isolator and detects a status of the plural battery cells which are included in a corresponding battery module, wherein the first control devices are integrated circuits having input and output signal circuits, voltage detecting circuits, input signal terminals, output signal terminals, and detecting terminals, said input and output signal circuits receiving a signal through said input signal terminals and sending a signal through said output signal terminals, and said voltage detecting circuits detecting a voltage of each of the corresponding plural battery cells through said detecting terminals, and said integrated circuits have different reference potentials, and are connected in series by connecting said output signal terminals and said input signal terminals between the serially connected integrated circuits which are connected in an electrically non-isolated manner.

21. The battery apparatus according to one of claims 1-3, wherein the isolator separates different current flows.

* * * * *